US012166327B2

(12) United States Patent
Mason et al.

(10) Patent No.: US 12,166,327 B2
(45) Date of Patent: Dec. 10, 2024

(54) SERIES OF STACKED CONFOCAL PULSE STRETCHERS FOR SPECKLE REDUCTION

(71) Applicant: Cymer, LLC, San Diego, CA (US)

(72) Inventors: Eric Anders Mason, San Diego, CA (US); Zhong Quan Zhao, San Diego, CA (US); Hong Ye, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 198 days.

(21) Appl. No.: 17/765,193

(22) PCT Filed: Oct. 14, 2020

(86) PCT No.: PCT/US2020/055623
§ 371 (c)(1),
(2) Date: Mar. 30, 2022

(87) PCT Pub. No.: WO2021/076658
PCT Pub. Date: Apr. 22, 2021

(65) Prior Publication Data
US 2022/0393420 A1 Dec. 8, 2022

Related U.S. Application Data

(60) Provisional application No. 62/916,139, filed on Oct. 16, 2019.

(51) Int. Cl.
G03B 7/20 (2021.01)
G02B 17/00 (2006.01)
(Continued)

(52) U.S. Cl.
CPC .......... *H01S 3/0057* (2013.01); *G02B 17/004* (2013.01); *G02B 27/145* (2013.01);
(Continued)

(58) Field of Classification Search
CPC ...... H01S 3/0057; H01S 3/0071; H01S 3/225; H01S 3/005; H01S 3/2333; G02B 17/004;
(Continued)

(56) References Cited

U.S. PATENT DOCUMENTS 6,535,531 B1  3/2003  Smith et al.
6,928,093 B2  8/2005  Webb et al.
(Continued)

FOREIGN PATENT DOCUMENTS

EP  2036170 B1  8/2013
JP  2000223396 A  8/2000
(Continued)

OTHER PUBLICATIONS

Office Action, counterpart Taiwan Patent Application No. 109135095, mailed Jun. 21, 2023, 13 pages total (including English translation of 5 pages).
(Continued)

Primary Examiner — Mesfin T Asfaw
(74) Attorney, Agent, or Firm — DiBerardino McGovern IP Group LLC

(57) ABSTRACT

An extended optical pulse stretcher is provided that combines confocal pulse stretchers in combination to produce, for example, 4 reflections, 4 reflections, 12 reflections, and 12 reflections per optical circuit configuration. The inclusion of the combination of different mirror separations and delay path lengths can result in very long pulse stretching, long optical delays, and minimal efficiency losses. Also, in the extended optical pulse stretcher, at least a beam splitter can be positioned relative to the center of curvature of the mirrors to "flatten" each of the circuits to enable the beam to propagate in the same plane (e.g., parallel to the floor). Also, the curvatures and sizes of the individual mirrors can be designed to position the beam splitter closer to one of the
(Continued)

banks of mirrors to allow the optical pulse stretchers to properly fit in an allocated location in a laser system.

38 Claims, 11 Drawing Sheets

(51) Int. Cl.
  *G02B 27/14* (2006.01)
  *G03F 7/00* (2006.01)
  *H01S 3/00* (2006.01)
  *H01S 3/225* (2006.01)

(52) U.S. Cl.
  CPC ........ *G03F 7/70025* (2013.01); *H01S 3/0071* (2013.01); *H01S 3/225* (2013.01)

(58) Field of Classification Search
  CPC .... G02B 27/145; G02B 27/48; G02B 27/144; G03F 7/70025; G03F 7/70041
  See application file for complete search history.

(56) References Cited

U.S. PATENT DOCUMENTS

| | | | |
|---|---|---|---|
| 7,369,597 B2 | 5/2008 | Smith et al. | |
| 7,415,056 B2 | 8/2008 | Das et al. | |
| 7,643,528 B2 | 1/2010 | Partlo et al. | |
| 8,885,144 B2 | 11/2014 | Classens et al. | |
| 9,709,897 B2 | 7/2017 | Mason et al. | |
| 11,079,564 B2 | 8/2021 | Barnhart | |
| 2007/0237192 A1 | 10/2007 | Das et al. | |
| 2008/0144671 A1 | 6/2008 | Ershov et al. | |
| 2008/0165337 A1* | 7/2008 | Ershov | G03F 7/70625 430/322 |
| 2009/0052480 A1* | 2/2009 | Cobb | G03F 7/70041 372/25 |
| 2009/0296758 A1 | 12/2009 | Brown et al. | |
| 2010/0302522 A1 | 12/2010 | Venkataraman et al. | |
| 2013/0148185 A1* | 6/2013 | Michaloski | B23K 26/067 359/238 |
| 2016/0126690 A1 | 5/2016 | Li et al. | |
| 2016/0248219 A1* | 8/2016 | Wakabayashi | H01S 3/2375 |

FOREIGN PATENT DOCUMENTS

| | | |
|---|---|---|
| JP | 2006186046 A | 7/2006 |
| JP | 2007511908 A | 5/2007 |
| JP | 2009532864 A | 9/2009 |
| JP | 2010278431 A | 12/2010 |
| JP | 5335671 B2 | 8/2013 |
| KR | 20110091788 A | 8/2011 |
| KR | 20110129819 A | 12/2011 |
| TW | 200737625 A | 10/2007 |
| WO | 2005050795 A2 | 6/2005 |
| WO | 2006012062 A2 | 2/2006 |

OTHER PUBLICATIONS

Robert Laenen, European International Searching Authority, International Search Report and Written Opinion, corresponding PCT Application No. PCT/US2020/055623, mailed Jan. 20, 2021, 13 pages total.

Examiner Hong, Seong Eui, Examination Bureau, Korean Intellectual Property Office, Office Action, counterpart Korean Patent Application No. 10-2022-7012801, mailed Aug. 7, 2023, 12 pages total (including English translation of 5 pages).

JPO Examiner Takakazu Ueki, Office Action, counterpart Japanese Patent Application No. 2022-518912, mailed May 18, 2023, 8 pages total (including English translation of 4 pages).

* cited by examiner

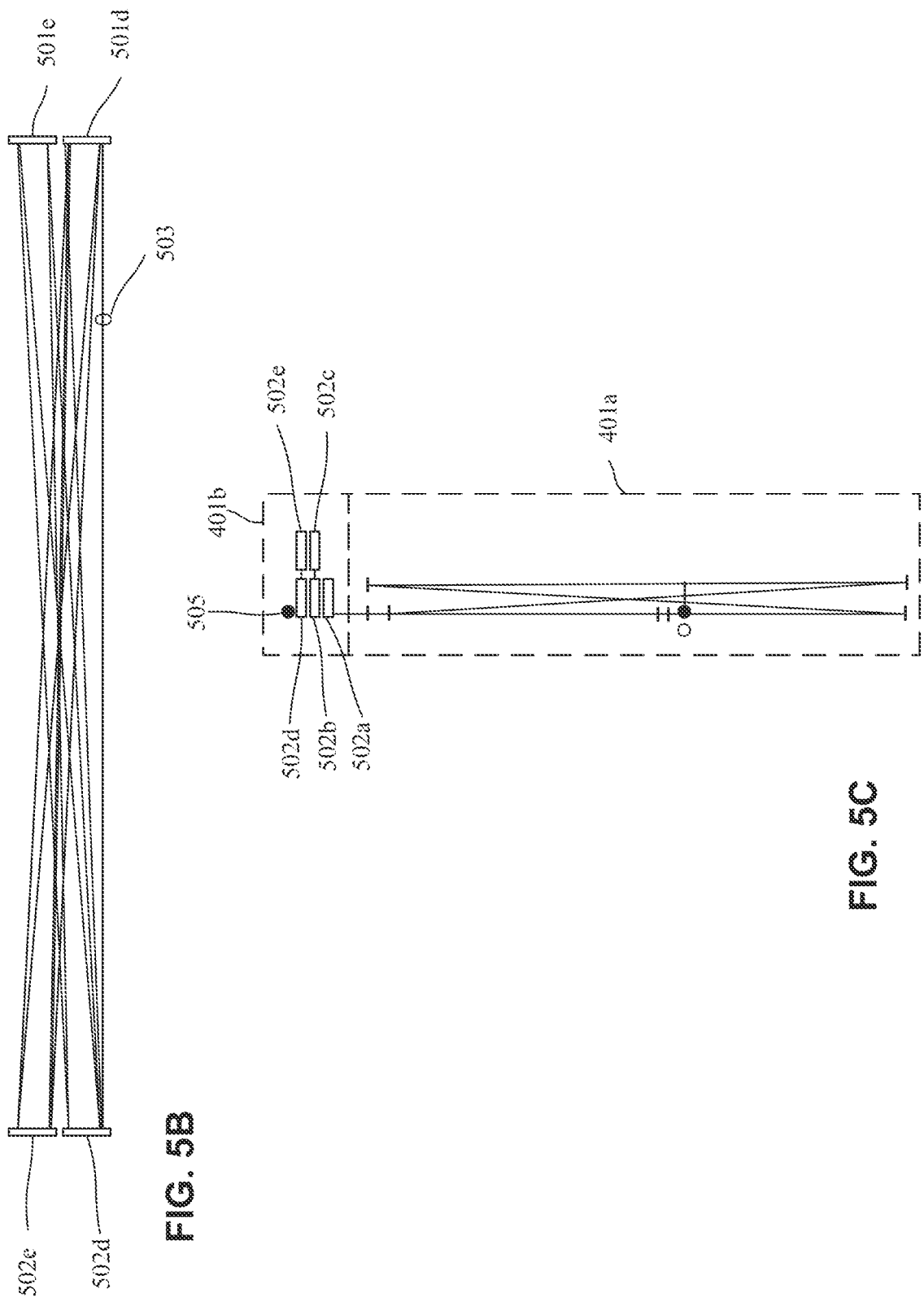

SERIES OF STACKED CONFOCAL PULSE STRETCHERS FOR SPECKLE REDUCTION

CROSS REFERENCE TO RELATED APPLICATION

This application claims priority to U.S. Application No. 62/916,139, filed Oct. 16, 2019 and titled SERIES OF STACKED CONFOCAL PULSE STRETCHERS FOR SPECKLE REDUCTION, which is incorporated herein in its entirety by reference.

FIELD

The present disclosure relates to optical pulse stretchers useful for lengthening the pulse of the output of a laser source, such as a high power gas discharge laser system, to reduce peak power of the pulse while delivering essentially the same dose, for example, for use as a pulsed light source in, for example, lithographic apparatuses.

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus includes so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

A laser source can be used with the lithographic apparatus for, for example, generating illumination radiation for illuminating the patterning device. The laser source can include an optical pulse stretcher for lengthening the pulse of the output of a high power gas discharge laser system. However, existing technology may not provide sufficient pulse stretching, with sufficient optical efficiency, nor may it fit in the available volume of the laser source.

SUMMARY

Embodiments of stacked confocal pulse stretchers designed to achieve the very long pulse stretching as well as the ability to fit in the available laser volume are described in the present disclosure.

One aspect of the present disclosure provides an optical pulse stretcher configured to receive a laser beam and generate an output pulse stretched laser beam. The optical pulse stretcher includes a first stage optical pulse stretcher including two or more mirrors and configured to receive a portion of the laser beam and generate a first pulse stretched laser beam. The optical pulse stretcher further includes a second stage optical pulse stretcher including four or more mirrors and configured to receive a portion of the first pulse stretched laser beam and generate a second pulse stretched laser beam. The optical pulse stretcher also includes a third stage optical pulse stretcher including four or more mirrors and configured to receive a portion of the second pulse stretched laser beam and generate the output pulse stretched laser beam.

In some embodiments, the two or more mirrors of the first stage optical pulse stretcher, the four or more mirror of the second stage optical pulse stretcher, and the four or more mirrors of the third stage optical pulse stretcher include concave mirrors.

In some embodiments, the two mirrors of the first stage optical pulse stretcher, the four mirror of the second stage optical pulse stretcher, and the four mirrors of the third stage optical pulse stretcher include rectangular concave mirrors.

In some embodiments, the first stage optical pulse stretcher is configured to generate the first pulse stretched laser beam by reflecting the portion of the laser beam four times using the two or more mirrors of the first stage optical pulse stretcher. Also, in some embodiments, the second stage optical pulse stretcher is configured to generate the second pulse stretched laser beam by reflecting the portion of the first pulse stretched laser beam twelve times using the four or more mirrors of the second stage optical pulse stretcher. Further, in some embodiments, third stage optical pulse stretcher is configured to generate the output pulse stretched laser beam by reflecting the portion of the second pulse stretched laser beam twelve times using the four or more mirrors of the third stage optical pulse stretcher.

In some embodiments, the optical pulse stretcher further includes a first beam splitter corresponding to the first stage optical pulse stretcher and configured to receive the laser beam and direct the portion of the laser beam to the two or more mirrors of the first stage optical pulse stretcher. In some embodiments, the first beam splitter can be positioned closer to a first one of the two or more mirrors of the first optical pulse stretcher and the first beam splitter can be a D shape beam splitter. In some embodiments, the first beam splitter is positioned relative to a center of curvature of the two or more mirrors to flatten the first stage optical pulse stretcher and to enable the portion of the laser beam to propagate in the first stage optical pulse stretcher in a same plane.

In some embodiments, the optical pulse stretcher further includes a second beam splitter corresponding to the second stage optical pulse stretcher and configured to receive the first pulse stretched laser beam and direct the portion of the first pulse stretched laser beam to the four or more mirrors of the second stage optical pulse stretcher. According to some embodiments, the second beam splitter is positioned relative to a center of curvature of the four or more mirrors of the second stage optical pulse stretcher to flatten the second stage optical pulse stretcher and to enable the portion of the first pulse stretched laser beam to propagate in the second stage optical pulse stretcher in a same plane.

In some embodiments, the optical pulse stretcher can further include a third beam splitter corresponding to the third stage optical pulse stretcher and configured to receive the second pulse stretched laser beam and direct the portion of the second pulse stretched laser beam to the four or more mirrors of the third stage optical pulse stretcher. In some embodiments, the third beam splitter is positioned relative to a center of curvature of the four or more mirrors of the third stage optical pulse stretcher to flatten the third stage optical pulse stretcher and to enable the portion of the second pulse stretched laser beam to propagate in the third stage optical pulse stretcher in a same plane.

In some embodiments, the second beam splitter is positioned closer to a first pair of the four or more mirrors of the second optical pulse stretcher and the second beam splitter can be a D shape beam splitter. In some embodiments, the third beam splitter is positioned closer to a first pair of the four or more mirrors of the third optical pulse stretcher and the third beam splitter can be a D shape beam splitter.

In some embodiments, the laser beam received by the first stage optical pulse stretcher is a pulse stretched laser beam generated by an orthogonal stage optical pulse stretcher, where the orthogonal stage optical pulse stretcher is positioned outside of and perpendicular or approximately perpendicular to the optical pulse stretcher. In some embodiments, the orthogonal stage optical pulse stretcher is configured to reflect the portion of the laser beam four times.

Another aspect of the present disclosure provides a laser source. The laser source includes an optical pulse stretcher configured to receive a laser beam and generate an output pulse stretched laser beam. The optical pulse stretcher includes a first stage optical pulse stretcher including two mirrors and configured to receive a portion of the laser beam and generate a first pulse stretched laser beam. The optical pulse stretcher further includes a second stage optical pulse stretcher including four or more mirrors and configured to receive a portion of the first pulse stretched laser beam and generate a second pulse stretched laser beam. The optical pulse stretcher also includes a third stage optical pulse stretcher including four or more mirrors and configured to receive a portion of the second pulse stretched laser beam and generate the output pulse stretched laser beam.

Another aspect of the present disclosure provides a lithographic apparatus that includes an illumination system configured to condition a radiation beam, a support structure configured to support a patterning device, a substrate table configured to hold a substrate, a projection system configured to project a pattern imparted to the radiation beam by the patterning device onto a target portion of the substrate. The illumination system includes a laser source. The laser source includes an optical pulse stretcher configured to receive a laser beam and generate an output pulse stretched laser beam. The optical pulse stretcher includes a first stage optical pulse stretcher including a first plurality of confocal resonators and configured to receive a portion of the laser beam and generate a first pulse stretched laser beam. The optical pulse stretcher further includes a second stage optical pulse stretcher including a second plurality of confocal resonators and configured to receive a portion of the first pulse stretched laser beam and generate a second pulse stretched laser beam. The optical pulse stretcher further includes a third stage optical pulse stretcher including a third plurality of confocal resonators and configured to receive a portion of the second pulse stretched laser beam and generate the output pulse stretched laser beam.

In some embodiments, the first stage optical pulse stretcher has a first optical delay. The second stage optical pulse stretcher has a second optical delay equal to or greater than the first optical delay. The third stage optical pulse stretcher has a third optical delay equal to or greater than the second optical delay.

Another aspect of the present disclosure provides an optical pulse stretcher configured to receive a laser beam and generate an output pulse stretched laser beam. The optical pulse stretcher includes two or more confocal optical pulse stretchers stacked in the optical pulse stretcher. A first one of the two or more confocal optical pulse stretchers is configured to receive a portion of the laser beam and generate a first pulse stretched laser beam by reflecting the portion of the laser beam four times. A second one of the two or more confocal optical pulse stretchers is configured to receive a portion of the first pulse stretched laser beam and generate a second pulse stretched laser beam by reflecting the portion of the first pulse stretched laser beam twelve times.

Another aspect of the present disclosure provides an extended optical pulse stretcher. The extended optical pulse stretcher includes a first stage optical pulse stretcher including a first plurality of confocal resonators and configured to receive a laser beam and generate a first pulse stretched laser beam. The extended optical pulse stretcher further includes a stacked confocal pulse stretcher. The stacked confocal pulse stretcher includes a second stage optical pulse stretcher including a second plurality of confocal resonators and configured to receive a portion of the first pulse stretched laser beam and generate a second pulse stretched laser beam. The stacked confocal pulse stretcher includes a third stage optical pulse stretcher including a third plurality of confocal resonators and configured to receive a portion of the second pulse stretched laser beam and generate a third pulse stretched laser beam. The stacked confocal pulse stretcher includes a fourth stage optical pulse stretcher including a fourth plurality of confocal resonators and configured to receive a portion of the third pulse stretched laser beam and generate the output pulse stretched laser beam. The first stage optical pulse stretcher is positioned perpendicular or approximately perpendicular to the stacked confocal pulse stretcher In some embodiments, the first stage optical pulse stretcher has a first optical delay. The second stage optical pulse stretcher has a second optical delay equal to or greater than the first optical delay. The third stage optical pulse stretcher has a third optical delay equal to or greater than the second optical delay. The fourth stage optical pulse stretcher has a fourth optical delay equal to or greater than the second optical delay.

Another aspect of the present disclosure provides a method for generating a laser beam and directing the laser beam through an optical pulse stretcher. The optical pulse stretcher includes a first stage optical pulse stretcher including a first plurality of confocal resonators and configured to receive a portion of the laser beam and generate a first pulse stretched laser beam. The optical pulse stretcher further includes a second stage optical pulse stretcher including a second plurality of confocal resonators and configured to receive a portion of the first pulse stretched laser beam and generate a second pulse stretched laser beam. The optical pulse stretcher also includes a third stage optical pulse stretcher including a third plurality of confocal resonators and configured to receive a portion of the second pulse stretched laser beam and generate the output pulse stretched laser beam.

Further features, as well as the structure and operation of various embodiments, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the embodiments of this disclosure and to enable a person skilled in the relevant art(s) to make and use the embodiments of this disclosure.

FIG. 5B illustrates a schematic of top view of the second optical pulse stretcher, according to some embodiments of the present disclosure.

FIG. 5C illustrates a schematic of side view of the extended optical pulse stretcher having the first optical pulse stretcher and the second optical pulse stretcher, according to some embodiments of the present disclosure.

Figure 1:
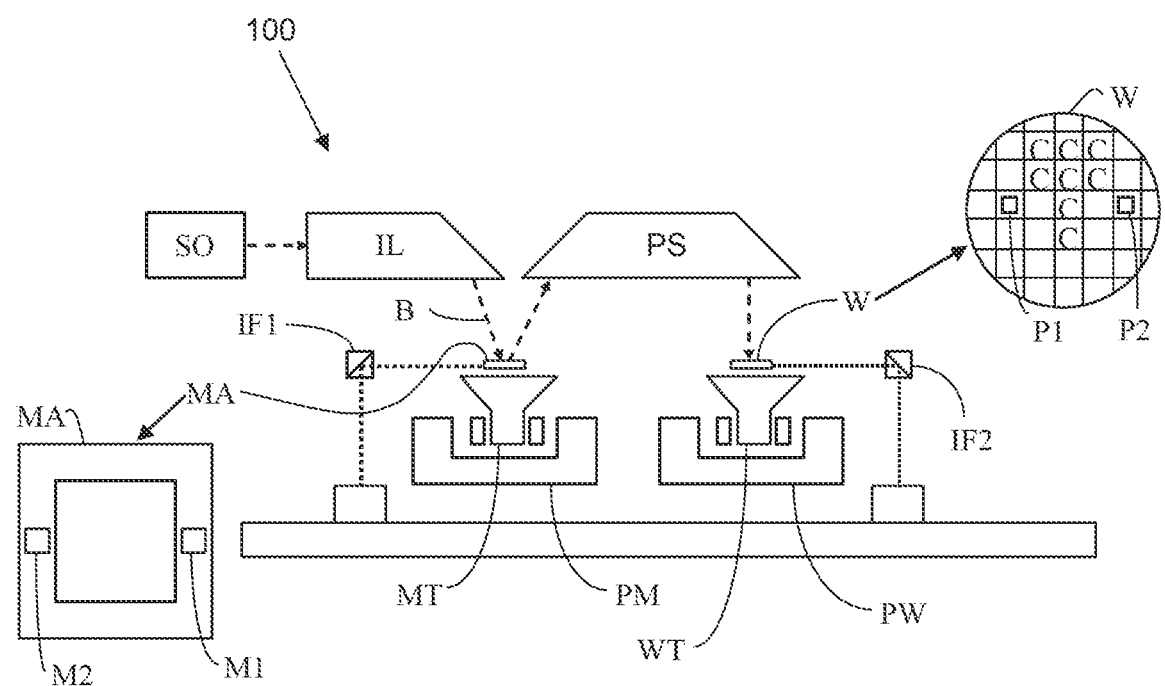
FIG. 1 is a schematic illustration of a reflective lithographic apparatus, according to an exemplary embodiment.

The features the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Before describing such embodiments in more detail, however, it is instructive to present an example environment in which embodiments of the present disclosure may be implemented.

Example Lithographic Systems

Figure 2:
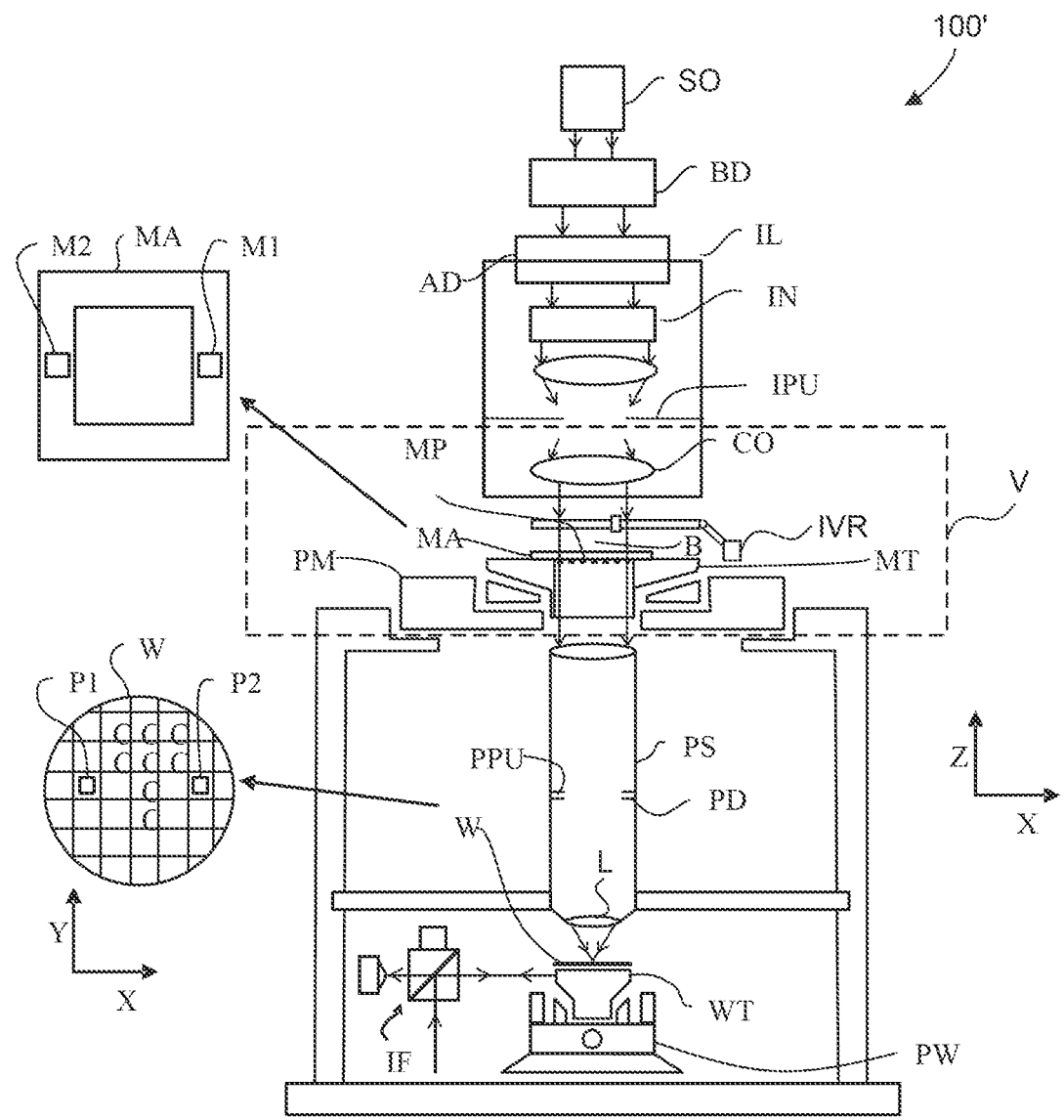
FIG. 2 is a schematic illustration of a transmissive lithographic apparatus, according to an exemplary embodiment.

FIGS. 1 and 2 are schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet (DUV) radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 2) or reflective (as in lithographic apparatus 100 of FIG. 1). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1 and 2, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 2) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 2) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 2), such as an integrator IN and a condenser CO. The illuminator IL can be used to condition the radiation beam B to have a desired uniformity and intensity distribution in its cross section.

Referring to FIG. 1, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 2, the radiation beam B is incident on the patterning device (for example, mask MA, which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations).

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 2) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

Exemplary Lithographic Cell

Figure 3:
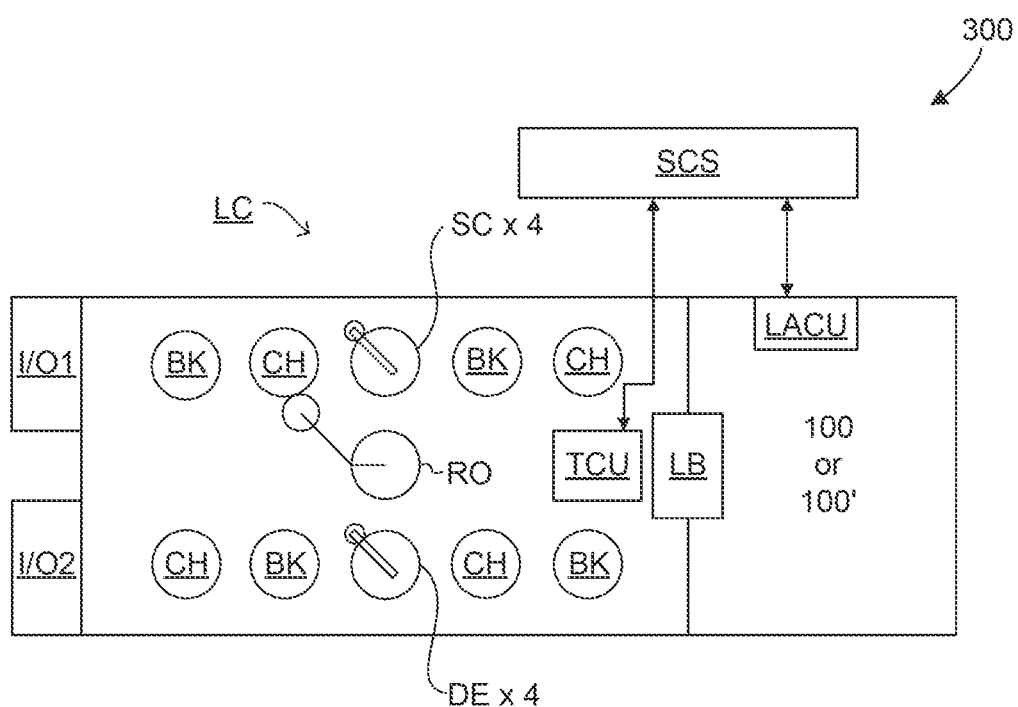
FIG. 3 is a schematic illustration of a lithographic cell, according to an exemplary embodiment.

FIG. 3 shows a lithographic cell 300, also sometimes referred to a lithocell or cluster. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Series of Stacked Confocal Pulse Stretchers

According to some embodiments, one or more extended optical pulse stretchers including a series of stacked optical pulse stretchers are provided for a laser source. The laser source can be used as part of, or in addition to, source SO of lithographic apparatus 100 or 100', according to some embodiments. Additionally, or alternatively, laser source can be used in generating DUV radiation to be used in lithographic apparatus 100 or 100' or other DUV lithographic apparatuses.

The laser source can be a gas discharge laser light source, for example, a KrF or ArF or molecular fluorine gas discharge laser, according to some embodiments. In some examples, the extended optical pulse stretchers including the series of stacked optical pulse stretchers of this disclosure can have a long optical delay, but constrained to have a practical physical length to be mounted on existing laser frames or contained within a beam delivery unit and fit, for example, in a fabrication facility clean room sub-floor room. According to some embodiments, the extended optical pulse stretcher of this disclosure combines confocal pulse stretchers in combination to produce 4 reflections, 4 reflections, 12 reflections, and 12 reflections per optical circuit configuration. According to some embodiments, the inclusion of the combination of different mirror separations and delay path lengths (e.g., 4 reflections and 12 reflections delay lengths) can result in very long pulse stretching, long optical delays, and minimal efficiency losses. The embodiments of this disclosure further can minimize the number of adjustment necessary to align a system and can allow for a considerable amount of misalignment. According to some embodiments, the extended optical pulse stretcher of this disclosure can produce 4 reflections, 4 reflections, 12 reflections, and 12 reflections using different combinations of mirrors in different optical circuits but other numbers of reflections may be utilized in other embodiments. Additionally, or alternatively, in the extended optical pulse stretcher of this disclosure, one or more beam splitters are positioned relative to the center of curvature of the mirrors to "flatten" each of the circuits to enable the beam to propagate in the same plane (e.g., parallel to the floor). Additionally, or alternatively, the curvatures and sizes of the individual mirrors can be designed to position the one or more beam splitters closer to one of the banks of mirrors to allow the upper beam splitters to be placed after the excimer laser cavities to allow the pulse stretchers to properly fit in an allocated location in laser system.

According to some embodiments, the extended optical pulse stretcher of this disclosure can be implemented in Nitrogen purge environment. Alternatively, the extended optical pulse stretcher of this disclosure can be implemented within a vacuum environment.

Figure 4:
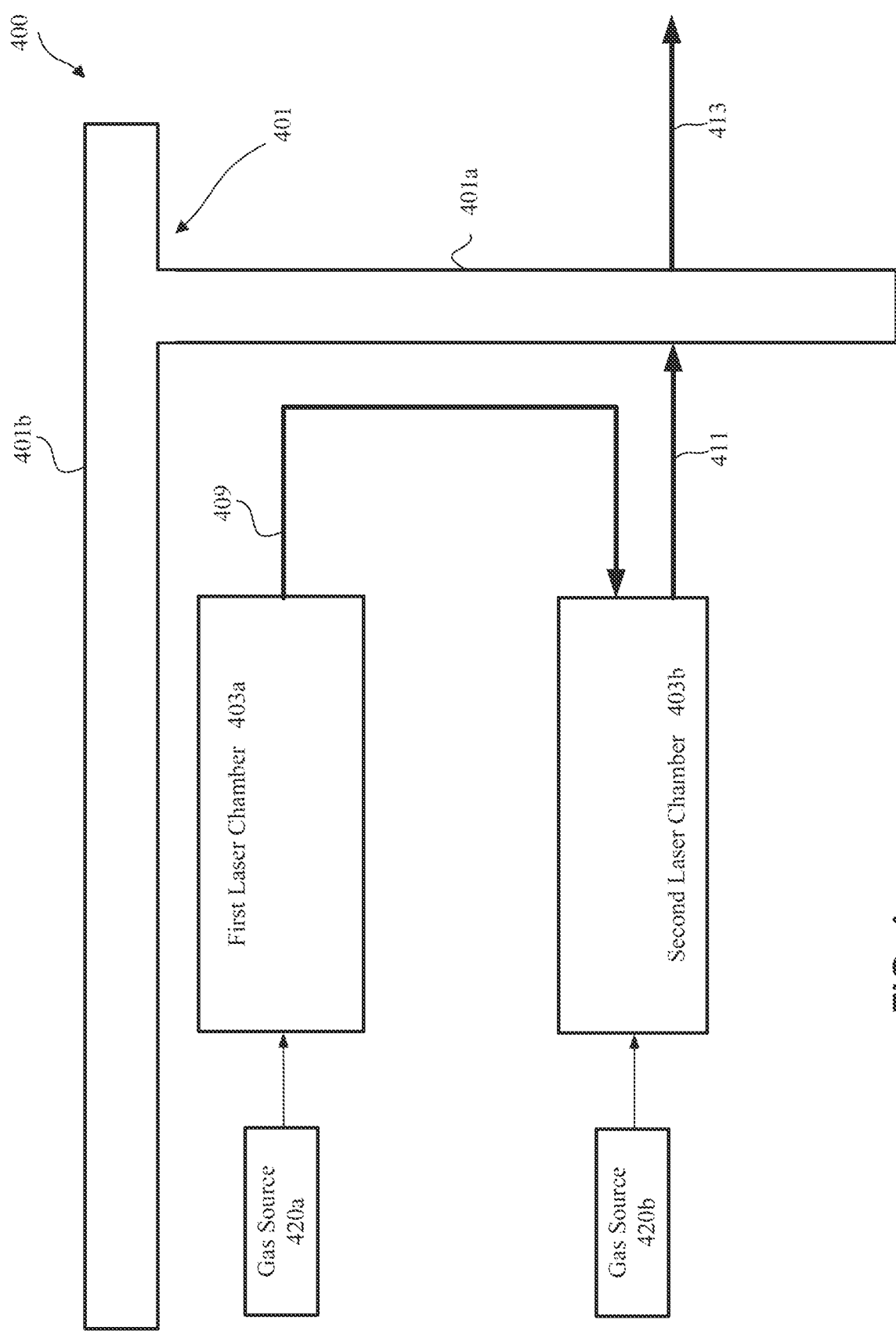
FIG. 4 illustrates a schematic of a laser source having an extended optical pulse stretcher, according to some embodiments of the present disclosure.

FIG. 4 illustrates a schematic of a laser source 400 having an extended optical pulse stretcher 401, according to some embodiments of the present disclosure. In some embodiments, laser source 400 can be used as part of, or in addition to, source SO of lithographic apparatus 100 or 100'. Additionally, or alternatively, laser source 400 can provide the laser used in source SO of FIG. 2. Additionally, or alternatively, laser source 400 can be used in generating DUV radiation to be used in lithographic apparatus 100 or 100' or other DUV lithographic apparatuses.

As illustrated in FIG. 4, laser source 400 can include a dual-chamber laser source. For example, laser source 400 can include a first laser chamber 403a and a second lase chamber 403b. In one exemplary embodiment, first laser chamber 403a can include or be part of a master oscillator. For example, laser source 400 can include the master oscillator where the maser source contains first laser chamber 403a. In this example, second laser chamber 403b can include or be part of a power amplifier. For example, the laser source can include the power amplifier where the power amplifier contains second laser chamber 403b. Although some embodiments are discussed with respect to a dual-chamber laser source, the embodiments of this disclosure are not limited to these examples. The embodiments of this disclosure can be applied to laser sources with one chamber or to laser sources with multiple laser chambers.

According to some embodiments, first chamber 403a generates a first laser beam 409, which is passed to second laser chamber 403b where first laser beam 409 is amplified to produce a second laser beam 411. Second laser beam 411 is input to extended optical pulse stretcher 401 where copies of second laser beam 411 are delayed and recombined to reduce speckle. Third laser beam 413 is output from extended optical pulse stretcher to the lithographic apparatus (e.g., lithographic apparatus 100 and/or 110').

According to some embodiments, each laser chamber 403a and 403b contains a mixture of gases. For example, in an excimer laser source, first laser chamber 403a and second laser chamber 403b can contain a halogen, for example, fluorine, along with other gases such as argon, neon, and possibly others in different partial pressures that add up to a total pressure. Laser chambers 403a and 403b can include other gases used in producing and amplifying laser beams. Additionally, or alternatively, laser chambers 403a and 403b can include same or different mixtures of gases.

In some embodiments, laser source 400 can include (or can be coupled) to gas sources (for example, gas bottles) 420a and 420b. For example, gas source 420a can be coupled to first laser chamber 403a to provide the gas mixture used for generating first laser beam 409. Additionally, gas source 420b can be coupled to second laser chamber 403b to provide the gas mixture used for generating second laser beam 411. In some examples, gas sources 420a and 420b can be coupled to laser chambers 403a and 403b, respectively, through valves (not shown). A control system (not shown) can be used to control the valves for sending gas from gas sources 420a and 420b to laser chambers 403a and 403b.

In some embodiments, gas source 420a can contain a mixture of gases including, but not limited to, fluorine, argon and neon. According to some embodiments, gas source 420b can contain a mixture of argon, neon and/or other gases, but no fluorine. However, other gas mixtures can be used in gas sources 420a and 420b.

According to some embodiments, and as discussed above, extended optical pulse stretcher 401 is configured to receive second laser beam 411 and delay and recombine copies of second laser beam 411 to reduce speckle. In some examples, speckle contrast can be defined using the intensity pattern of bright and dark spots generated by the interference of coherent light. The intensity contrast of the bright and dark region in speckle pattern can be a measure of coherence. In some examples, temporal coherence and spatial coherence can contribute to the overall coherence. The speckle contrast can be defined as standard deviation of the intensity variation divided by the mean intensity. In some examples, the speckle contrast can be estimated based on laser parameters.

According to some embodiments, extended optical pulse stretcher 401 can include two parts—first optical pulse stretcher 401a and second optical pulse stretcher 401b. For example, first optical pulse stretcher 401a receives second laser beam 411 and delays and recombines copies of second laser beam 411 to generate a first output laser beam. The first output laser beam is input to second optical pulse stretcher 401b. Second optical pulse stretcher 401b receives the first output laser beam and delays and recombines copies of the first output laser beam to generate a second output laser beam. The second output laser beam is input to first optical pulse stretcher 401a, where the second output laser beam is redirected as third laser beam 413.

According to some embodiments, second optical pulse stretcher 401b includes a series of stacked optical pulse stretchers. In other words, a number of optical pulse stretchers are stacked in second optical pulse stretcher 401b. Each one of the stages of the optical pulse stretchers (e.g., stage optical pulse stretcher) includes a plurality of confocal resonators. For example, optical pulse stretcher 401b can include a first stage optical pulse stretcher including a first plurality of confocal resonators. Optical pulse stretcher 401b further includes a second stage optical pulse stretcher including a second plurality of confocal resonators. Optical pulse stretcher 401b further includes a third stage optical pulse stretcher including a third plurality of confocal resonators. According to some examples, the first plurality of confocal resonators includes two rectangular concave mirrors, the second plurality of confocal resonators comprises four rectangular concave mirrors, and the third plurality of confocal resonators comprises four rectangular concave mirrors. However, the embodiments of this disclosure can include other number of stages of optical pulse stretchers in optical pulse stretcher 401b and each stage optical pulse stretcher can include other number of confocal resonators.

Figure 5A:
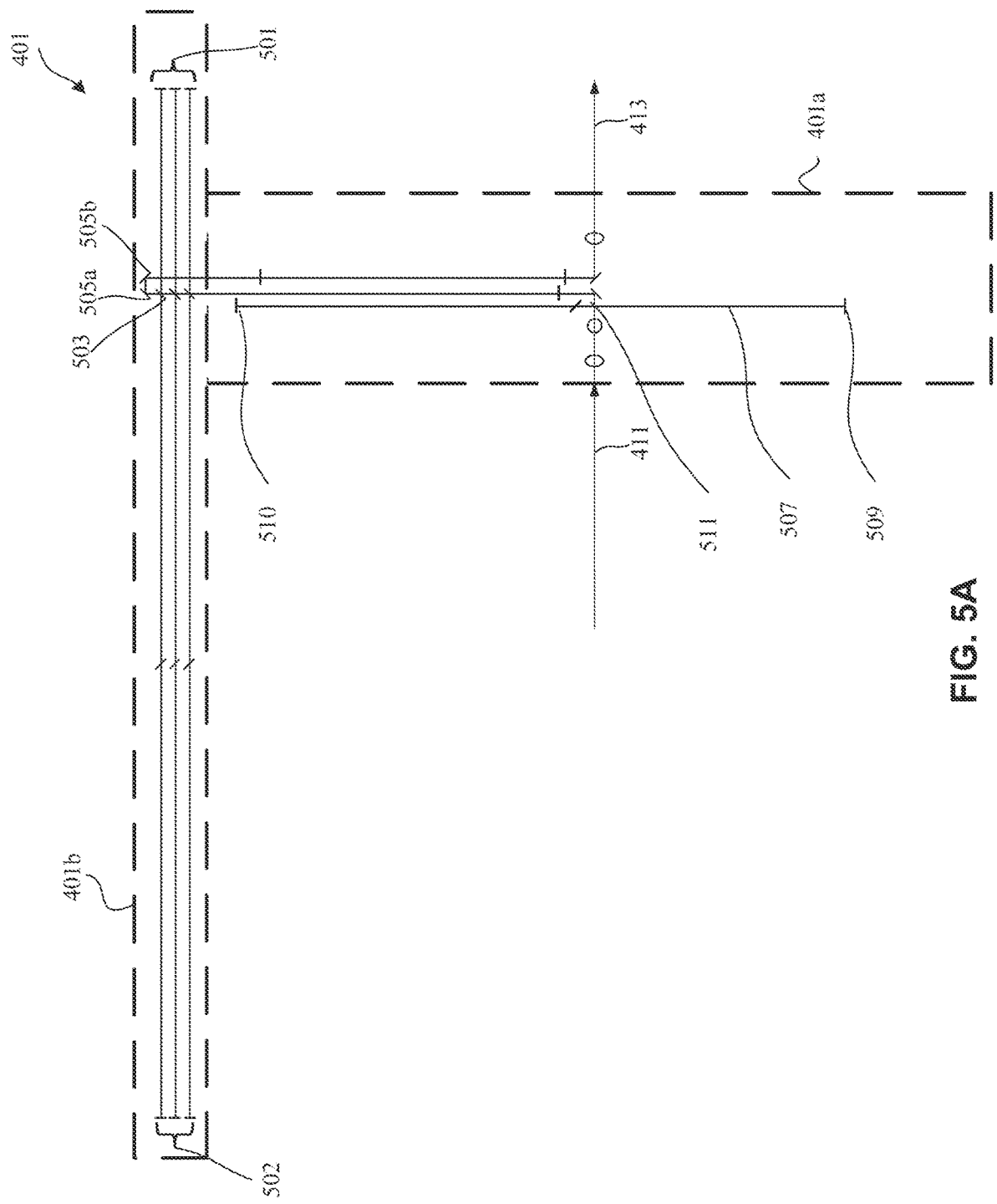
FIG. 5A illustrates a schematic of front view of extended optical pulse stretcher having a first optical pulse stretcher and a second optical pulse stretcher, according to some embodiments of this disclosure.

Also, the embodiments of this disclosure can include other types of mirrors as the confocal resonators. Further, the relative orientation of first optical pulse stretcher 401*a* and second optical pulse stretcher 401*b*, arranged orthogonally in FIG. 4 is provided by way of example only and other relative configurations and orientations may be used in other embodiments FIG. 5A illustrates a schematic of front view of extended optical pulse stretcher 401 having first optical pulse stretcher 401*a* and second optical pulse stretcher 401*b*, according to some embodiments of the present disclosure.

According to some embodiments, and as discussed in more detail below, first optical pulse stretcher 401*a* can include one stage optical pulse stretcher 507 with an optical design including four mirrors (first pair of mirrors 509 and second pair of mirrors 510) that produce four reflections of the laser beam between them. Although this example is discussed with four mirrors, one stage optical pulse stretcher 507 can include other numbers of mirrors. These mirrors can be positioned to generate four reflections of the laser beam. In some embodiments, the two pairs of mirrors 509 and 510 of one stage optical pulse stretcher 507 of first optical pulse stretcher 401*a* can be separated from each other by a physical distance of about 1 m-3 m. For example, the physical distance can be about 1.5 m to 2.5 m. These distances are provided by way of example only and other distances can be used in other embodiments. In some examples, one stage optical pulse stretcher 507 of first optical pulse stretcher 401*a* can be capable of optical pulse stretching having, from example, an optical delay of about 30 ns-50 ns. For example, an optical delay of about 35 ns-45 ns. For example, an optical delay of about 40 ns-44 ns. It is noted that the example physical distances between the two mirrors and the example optical delays provided do not limit the embodiments of this disclosure. First optical pulse stretcher 401*a* can be designed such that various other physical distances and/or various optical delays are achieved.

According to some embodiments, each of the mirrors in the two pairs of mirrors 509 and 510 of one stage optical pulse stretcher 507 of first optical pulse stretcher 401*a* can include circular concave mirrors.

According to some embodiments, first optical pulse stretcher 401*a* can include additional optical elements. In one example, one stage optical pulse stretcher 507 of first optical pulse stretcher 401*a* can include beam splitter 511 used to split laser beam 411 and to generate copies of laser beam 411. Beam splitter 511 of first optical pulse stretcher 401*a* can have a reflectivity of, for example, about 50%-70%. In some examples, the beam splitter 511 can have a reflectivity of about 55%-65%. But the embodiments of this disclosure are not limited to these examples and various other values of reflectivity can be used. In some examples, the reflectivity of the beam splitter 511 can depend on and/or be calculated based on the reflectivity of the mirrors used in first optical pulse stretcher 401*a*.

Additionally, first optical pulse stretcher 401*a* can include beam turning, beam relay, and/or alignment features.

According to some embodiments, and as discussed in more detail below, second optical pulse stretcher 401*b* can include two or more (for example, three) stages of confocal optical pulse stretchers. In some examples, these three stages of confocal optical pulse stretcher can be positioned in approximately parallel to each other in second optical pulse stretcher 401*b*. In some embodiments, second optical pulse stretcher 401*b* can be positioned in perpendicular or approximately perpendicular to first optical pulse stretcher 401*a*. In other words, in some embodiments, first optical pulse stretcher 401*a* (e.g., an orthogonal optical pulse stretcher that may be positioned vertically) is positioned in perpendicular or approximately perpendicular to the two or more (for example, three) stages of confocal optical pulse stretchers of second optical pulse stretcher 401*b*. According to some embodiments, second optical pulse stretcher 401*b* is designed such that it provides additional optical delay, achieves very long pulse stretching, it is stable that may require no additional adjustments for alignment, and can be mounted on existing laser frames or contained within a beam delivery unit and fit in available laser volume (for example, fit in a fabrication facility clean room sub-floor room). For example, second optical pulse stretcher 401*b* can be fit in tight spaces, for example, over first laser chamber 403*a*.

According to some embodiments, the extended optical pulse stretcher 401 combines two or more confocal optical pulse stretchers. For example, extended optical pulse stretcher 401 combines confocal optical pulse stretchers in the combination of 4 reflections, 4 reflections, 12 reflections, and 12 reflections per optical circuit configuration. According to some embodiments, the inclusion of the combination of different mirror separations and delay path lengths (e.g., 4 reflections and 12 reflections delay lengths) can result in very long pulse stretching and minimal efficiency losses.

According to some embodiments, second optical pulse stretcher 401*b* can include three stages of confocal optical pulse stretchers. However, the embodiments of this disclosure are not limited to these examples, and second optical pulse stretcher 401*b* can include other numbers of stages of confocal optical pulse stretchers. In some examples, the first stage of second optical pulse stretcher 401*b* is discussed as having two mirrors. However, the embodiments of this disclosure are not limited to these examples and the first stage of second optical pulse stretcher 401*b* can include other numbers (for example two or more) and/or configurations of mirrors. In some examples, the plurality of mirrors used in the first stage of second optical pulse stretcher 401*b* are configured to generate four reflections of the laser beam between them.

In some examples, the second stage of second optical pulse stretcher 401*b* is discussed as having four mirrors. However, the embodiments of this disclosure are not limited to these examples and the second stage of second optical pulse stretcher 401*b* can include other numbers (for example four or more) and/or configurations of mirrors. In some examples, the plurality of mirrors used in the second stage of second optical pulse stretcher 401*b* are configured to generate twelve reflections of the laser beam between them.

In some examples, the third stage of second optical pulse stretcher 401*b* is discussed as having four mirrors. However, the embodiments of this disclosure are not limited to these examples and the third stage of second optical pulse stretcher 401*b* can include other numbers (for example four or more) and/or configurations of mirrors. In some examples, the plurality of mirrors used in the third stage of second optical pulse stretcher 401*b* are configured to generate twelve reflections of the laser beam between them.

According to some embodiments, first optical pulse stretcher 401*a* and the stages of second optical pulse stretcher 401*b* are designed such that optical delay increases from first optical pulse stretcher 401*a* to second optical pulse stretcher 401*b*. Also, the optical delay of each stage of second optical pulse stretcher 401*b* increases from the first to the third stage. For example, first optical pulse stretcher 401*a* (e.g., the orthogonal optical pulse stretcher) can have an optical delay. The first stage of second optical pulse stretcher 401b can have a first optical delay equal to or greater than the optical delay of first optical pulse stretcher 401a. The second stage of second optical pulse stretcher 401b can have a second optical delay equal to or greater than the first optical delay. The third stage of second optical pulse stretcher 401b can have a third optical delay equal to or greater than the second optical delay.

According to some embodiments, the optical delay can be determined based on the distance that the beam travels within an optical pulse stretcher.

According to some embodiments, a first stage of second optical pulse stretcher 401b can have an optical design including two mirrors (e.g., two lower mirrors of mirrors 501 and 502 in FIG. 5A) that produce four reflections of the laser beam between them. Although this example is discussed with two mirrors, the first stage of second optical pulse stretcher 401b can include other numbers of mirrors (for example, two or more mirrors). These mirrors can be positioned to generate four reflections of the laser beam between them. In some embodiments, the two mirrors of the first stage of second optical pulse stretcher 401b can be separated from each other by a physical distance of about 2 m-4 m. For example, the physical distance can be about 2.5 m to 3.5 m. These distances are provided by way of example only and other distances can be used in other embodiments. In some examples, the first stage of second optical pulse stretcher 401b can be capable of optical pulse stretching having, from example, an optical delay of about 60 ns-80 ns. For example, an optical delay of about 65 ns-75 ns. For example, an optical delay of about 70 ns-75 ns. It is noted that the example physical distance between the two mirrors and the example optical delays provided do not limit the embodiments of this disclosure. The first stage of second optical pulse stretcher 401b can be designed such that various other physical distances and/or various optical delays are achieved.

According to some embodiments, mirrors (e.g., the two lower mirrors of mirrors 501 and 502) of the first stage of second optical pulse stretcher 401b can include rectangular concave mirrors. For example, two large rectangular concave mirrors can be used but in other embodiments other shapes are used. According to some embodiments, the reflective surface of the mirrors can be spherically concave such that the distance between the two mirrors (e.g., the surfaces of the two lower mirrors of mirrors 501 and 502) of the first stage of second optical pulse stretcher 401b is equal to (or about equal to) the radius of the curvature of each of the two mirrors. For example, the mirrors can be designed and positioned based on a telecentric design. The concave mirrors can be designed with orthogonal tip-tilt adjustment and also Z-axis (e.g., the direction of the propagation of beam) adjustment, according to some embodiments.

According to some embodiments, the first stage of second optical pulse stretcher 401b can include additional optical elements. In one example, the first stage of second optical pulse stretcher 401b can include a beam splitter (lower beam splitter of beam splitters 503 of FIG. 5A) used to split the laser beam and to generate copies of the laser beam. The beam splitter of the first stage of second optical pulse stretcher 401b can have a reflectivity of, for example, about 45%-65%. In some examples, the beam splitter can have a reflectivity of about 50%-60%. But the embodiments of this disclosure are not limited to these examples and various other values of reflectivity can be used. In some examples, the reflectivity of the beam splitter can depend on and/or be calculated based on the reflectivity of the mirrors used in the first stage of second optical pulse stretcher 401b.

According to some embodiments, a second stage of second optical pulse stretcher 401b can have an optical design including four mirrors (e.g., four middle mirrors of mirrors 501 and 502 in FIG. 5A) that produce twelve reflections of the laser beam between them.

Although this example is discussed with four mirrors, the second stage of second optical pulse stretcher 401b can include other numbers of mirrors (for example, four or more mirrors). These mirrors can be positioned to generate twelve reflections of the laser beam between them. In some embodiments, the two pairs of mirrors of the second stage of second optical pulse stretcher 401b can be separated from each other by a physical distance of about 2 m-4 m. For example, the physical distance can be about 2.5 m to 3.5 m. These distances are provided by way of example only and other distances can be used in other embodiments. In some examples, the second stage of second optical pulse stretcher 401b can be capable of optical pulse stretching having, from example, an optical delay of about 170 ns-210 ns. For example, an optical delay of about 180 ns-190 ns. For example, an optical delay of about 185 ns-195 ns. It is noted that the example physical distance between the two pairs of mirrors and the example optical delays provided do not limit the embodiments of this disclosure. The second stage of second optical pulse stretcher 401b can be designed such that various other physical distances and/or various optical delays are achieved.

According to some embodiments, mirrors (e.g., the four middle mirrors of mirrors 501 and 502) of the second stage of second optical pulse stretcher 401b can include rectangular concave mirrors. For example, four large rectangular concave mirrors can be used but in other embodiments other shapes are used. According to some embodiments, the reflective surface of the mirrors can be spherically concave such that the distance between the two pairs of mirrors (e.g., the surfaces of the two pairs of middle mirrors of mirrors 501 and 502) of the second stage of second optical pulse stretcher 401b is equal to (or about equal to) the radius of the curvature of each of the four mirrors. For example, the mirrors can be designed and positioned based on a telecentric design. The concave mirrors can be designed with orthogonal tip-tilt adjustment, according to some embodiments.

According to some embodiments, the second stage of second optical pulse stretcher 401b can include additional optical elements. In one example, the second stage of second optical pulse stretcher 401b can include a beam splitter (middle beam splitter of beam splitters 503 of FIG. 5A) used to split the laser beam and to generate copies of the laser beam. The beam splitter of the second stage of second optical pulse stretcher 401b can have a reflectivity of, for example, about 45%-65%. In some examples, the beam splitter can have a reflectivity of about 50%-60%. But the embodiments of this disclosure are not limited to these examples and various other values of reflectivity can be used. In some examples, the reflectivity of the beam splitter can depend on and/or be calculated based on the reflectivity of the mirrors used in the second stage of second optical pulse stretcher 401b.

According to some embodiments, a third stage of second optical pulse stretcher 401b can be similar to, or the same as, the second stage of second optical pulse stretcher 401b. For example, a third stage of second optical pulse stretcher 401b can have an optical design including four mirrors (e.g., four top mirrors of mirrors 501 and 502 in FIG. 5A) that produce twelve reflections of the laser beam between them. Although this example is discussed with four mirrors, the third stage of second optical pulse stretcher 401b can include other numbers of mirrors (for example, four or more mirrors). These mirrors can be positioned to generate twelve reflections of the laser beam between them. In some embodiments, the two pairs of mirrors of the third stage of second optical pulse stretcher 401b can be separated from each other by a physical distance of about 2 m-4 m. For example, the physical distance can be about 2.5 m to 3.5 m. These distances are provided by way of example only and other distances can be used in other embodiments. According to some examples, the distances between the mirrors in different stages of second optical pulse stretcher 401b can be similar, or the same.

In some examples, the second stage of second optical pulse stretcher 401b can be capable of optical pulse stretching having, from example, an optical delay of about 150 ns-190 ns. For example, an optical delay of about 160 ns-180 ns. For example, an optical delay of about 165 ns-175 ns. It is noted that the example physical distance between the two pairs of mirrors and the example optical delays provided do not limit the embodiments of this disclosure. The third stage of second optical pulse stretcher 401b can be designed such that various other physical distances and/or various optical delays are achieved.

According to some embodiments, mirrors (e.g., the four top mirrors of mirrors 501 and 502) of the third stage of second optical pulse stretcher 401b can include rectangular concave mirrors. For example, four large rectangular concave mirrors can be used but in other embodiments other shapes are used. According to some embodiments, the reflective surface of the mirrors can be spherically concave such that the distance between the two pairs of mirrors (e.g., the surfaces of the two pairs of top mirrors of mirrors 501 and 502) of the third stage of second optical pulse stretcher 401b is equal to (or about equal to) the radius of the curvature of each of the four mirrors. For example, the mirrors can be designed and positioned based on a telecentric design. The concave mirrors can be designed with orthogonal tip-tilt adjustment, according to some embodiments.

According to some embodiments, the third stage of second optical pulse stretcher 401b can include additional optical elements. In one example, the third stage of second optical pulse stretcher 401b can include a beam splitter (top beam splitter of beam splitters 503 of FIG. 5A) used to split the laser beam and to generate copies of the laser beam. The beam splitter of the third stage of second optical pulse stretcher 401b can have a reflectivity of, for example, about 45%-65%. In some examples, the beam splitter can have a reflectivity of about 50%-60%. But the embodiments of this disclosure are not limited to these examples and various other values of reflectivity can be used. In some examples, the reflectivity of the beam splitter can depend on and/or be calculated based on the reflectivity of the mirrors used in the third stage of second optical pulse stretcher 401b.

Second optical pulse stretcher 401b can include additional optical elements. For example, second optical pulse stretcher 401b can include mirrors 505a and 505b. Mirrors 505a and 505b can be used to direct the optically stretched laser beam back toward first optical pulse stretcher 401a, where the optically stretched laser beam can be output the laser source 400 as third laser beam 413. It is noted that according to some embodiments, the optically stretched laser beam redirected toward first optical pulse stretcher 401a does not go through stage 507 of first optical pulse stretcher 401a but it is redirected as third laser beam 413 outputting laser source 400.

According to some embodiments, mirrors 505a and 505b can include s-polarization mirrors mounted in about 45 degree (to provide an angle of incident of about 45 degree). However, other examples and/or orientations of mirrors 505a and 505b can be used with the embodiments of this disclosure.

FIG. 5B illustrates a schematic of top view of second optical pulse stretcher 401b, according to some embodiments of the present disclosure. FIG. 5C illustrates a schematic of side view of extended optical pulse stretcher 401 having first optical pulse stretcher 401a and second optical pulse stretcher 401b, according to some embodiments of the present disclosure.

In the top view of second optical pulse stretcher 401b of FIG. 5B, the four mirrors of, for example, the third stage of second optical pulse stretcher 401b are illustrated. These four mirrors can include two pairs of mirrors—mirrors 501d and 501e and mirrors 502d and 502e. The top view of FIG. 5B also illustrates beam splitter 503. The reflection and propagation of the laser beam between the four mirror of the second and third stages of second optical pulse stretcher 401b is further discussed below with respect to FIG. 7B.

In the side view of first optical pulse stretcher 401a and second optical pulse stretcher 401b of FIG. 5C, the five mirrors on one side of second optical pulse stretcher 401b are illustrated. In this example, mirror 502a of the first stage of second optical pulse stretcher 401b is illustrated. A mirror (e.g., mirror 501a) is on the other side of the first stage of second optical pulse stretcher 401b, which is not illustrated in this view. In this example, one pair of mirror 502b and 502c of the second stage of second optical pulse stretcher 401b is illustrated. Another pair of mirrors (e.g., a pair of mirrors 501b and 501c) is on the other side of the second stage of second optical pulse stretcher 401b, which is not illustrated in this view. Also, in this example, one pair of mirror 502d and 502e of the third stage of second optical pulse stretcher 401b is illustrated. Another pair of mirrors (e.g., a pair of mirrors 501d and 501e) is on the other side of the third stage of second optical pulse stretcher 401b, which is not illustrated in this view.

Figure 6A:
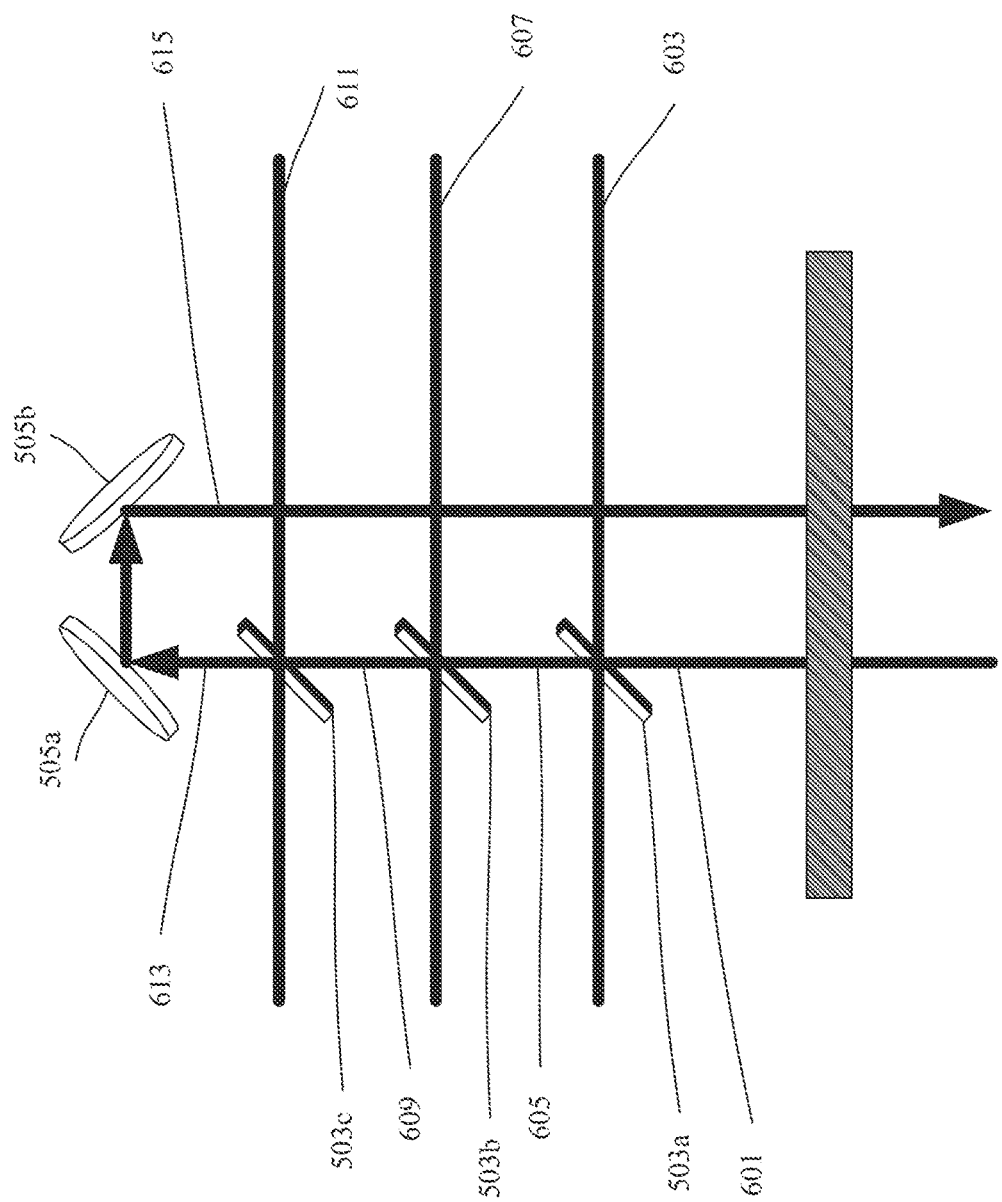
FIG. 6A illustrates a schematic view of part of the paths of laser beams in the second optical pulse stretcher, according to some embodiments of this disclosure.

FIG. 6A illustrates a schematic view of part of the paths of laser beams in second optical pulse stretcher 401b, according to some embodiments of the present disclosure.

As illustrated in FIG. 6A, laser beam 601, which is optically stretched using the stage of first optical pulse stretcher 401a enters second optical pulse stretcher 401b. Using first beam splitter 503a, laser beam 601 is split into laser beam 603 and laser beam 605. Laser beam 605 enters the second stage of second optical pulse stretcher 401b. Laser beam 603 enters the first stage of second optical pulse stretcher 401b, which includes two mirrors. After four reflections from the two mirrors of the first stage of second optical pulse stretcher 401b (as illustrated in, for example, FIG. 7A), the laser beam enters the second stage of second optical pulse stretcher 401b using beam splitter 503a.

Laser beam 605 (and/or the laser beam from the first stage of second optical pulse stretcher 401b) is split into laser beam 607 and laser beam 609. Laser beam 609 enters the third stage of second optical pulse stretcher 401b. Laser beam 607 enters the second stage of second optical pulse stretcher 401b, which includes four mirrors. After twelve reflections from the four mirrors of the second stage of second optical pulse stretcher 401b (as illustrated in, for example, FIG. 7B), the laser beam enters the third stage of enters second optical pulse stretcher 401b using beam splitter 503b.

Laser beam 609 (and/or the laser beam from the second stage of the second optical pulse stretcher 401b) is split into laser beam 611 and laser beam 613. Laser beam 613 is reflected using mirrors 505a and 505b back to first optical pulse stretcher 401a. Laser beam 611 enters the third stage of second optical pulse stretcher 401b, which includes four mirrors. After twelve reflections from the four mirrors of the third stage of second optical pulse stretcher 401b (as illustrated in, for example, FIG. 7B), the laser beam is reflected back to first optical pulse stretcher 401a using beam splitter 503c and mirrors 505a and 505b.

Figure 6B:
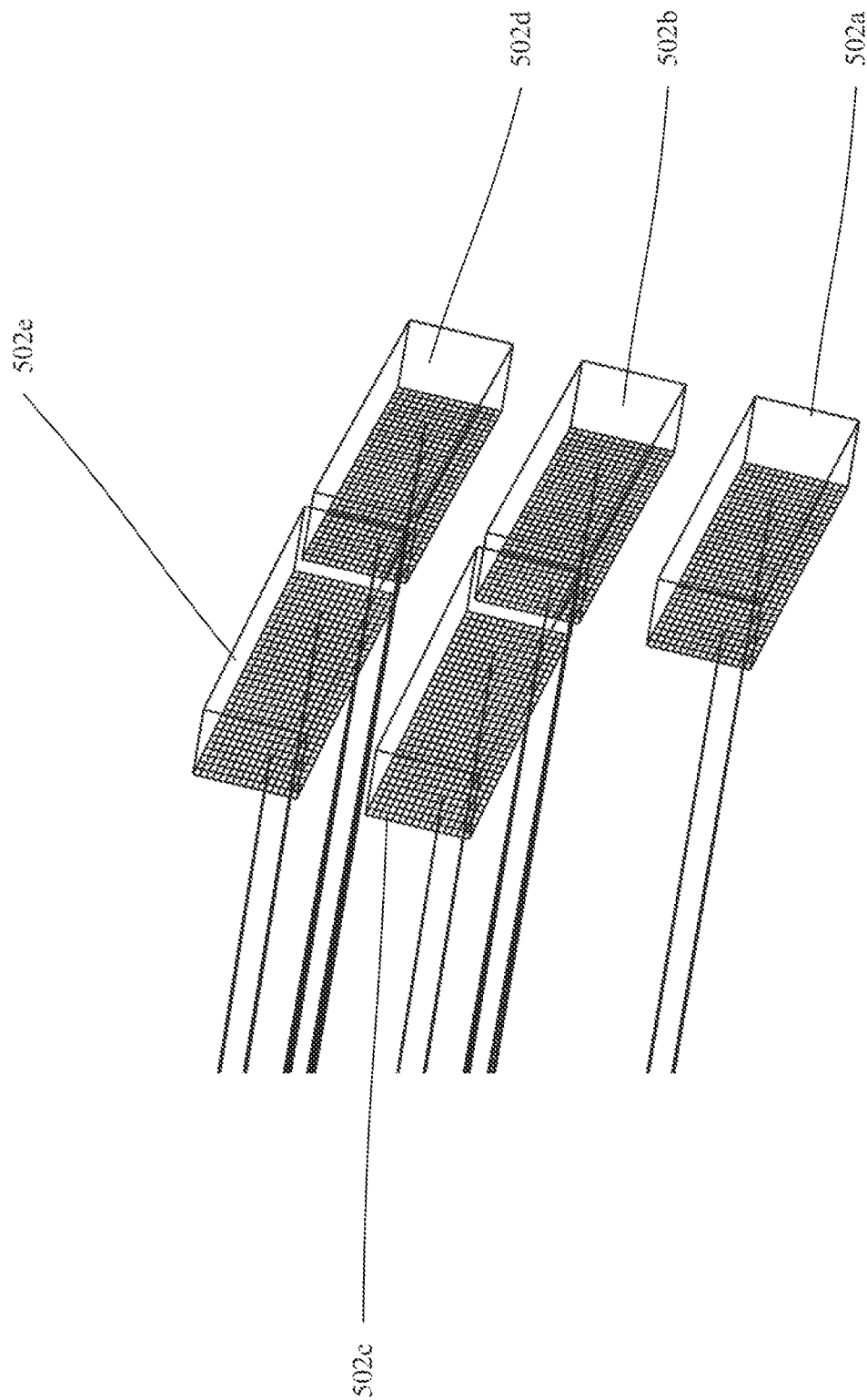
FIG. 6B illustrates a schematic view of part of the paths of laser beams in the second optical pulse stretcher and parts of mirrors used in the second optical pulse stretcher, according to some embodiments of the present disclosure.

FIG. 6B illustrates a schematic view of part of the paths of laser beams in second optical pulse stretcher 401b and parts of mirrors used in second optical pulse stretcher 401b, according to some embodiments of the present disclosure.

In FIG. 6B, the five mirrors on one side of second optical pulse stretcher 401b are illustrated. In this example, mirror 502a of the first stage of second optical pulse stretcher 401b is illustrated. A mirror (e.g., mirror 501a) is on the other side of the first stage of second optical pulse stretcher 401b, which is not illustrated in this view. In this example, one pair of mirror 502b and 502c of the second stage of second optical pulse stretcher 401b is illustrated. Another pair of mirrors (e.g., a pair of mirrors 501b and 501c) is on the other side of the second stage of second optical pulse stretcher 401b, which is not illustrated in this view. Also, in this example, one pair of mirror 502d and 502e of the third stage of second optical pulse stretcher 401b is illustrated. Another pair of mirrors (e.g., a pair of mirrors 501d and 501e) is on the other side of the third stage of second optical pulse stretcher 401b, which is not illustrated in this view.

Figure 7A:
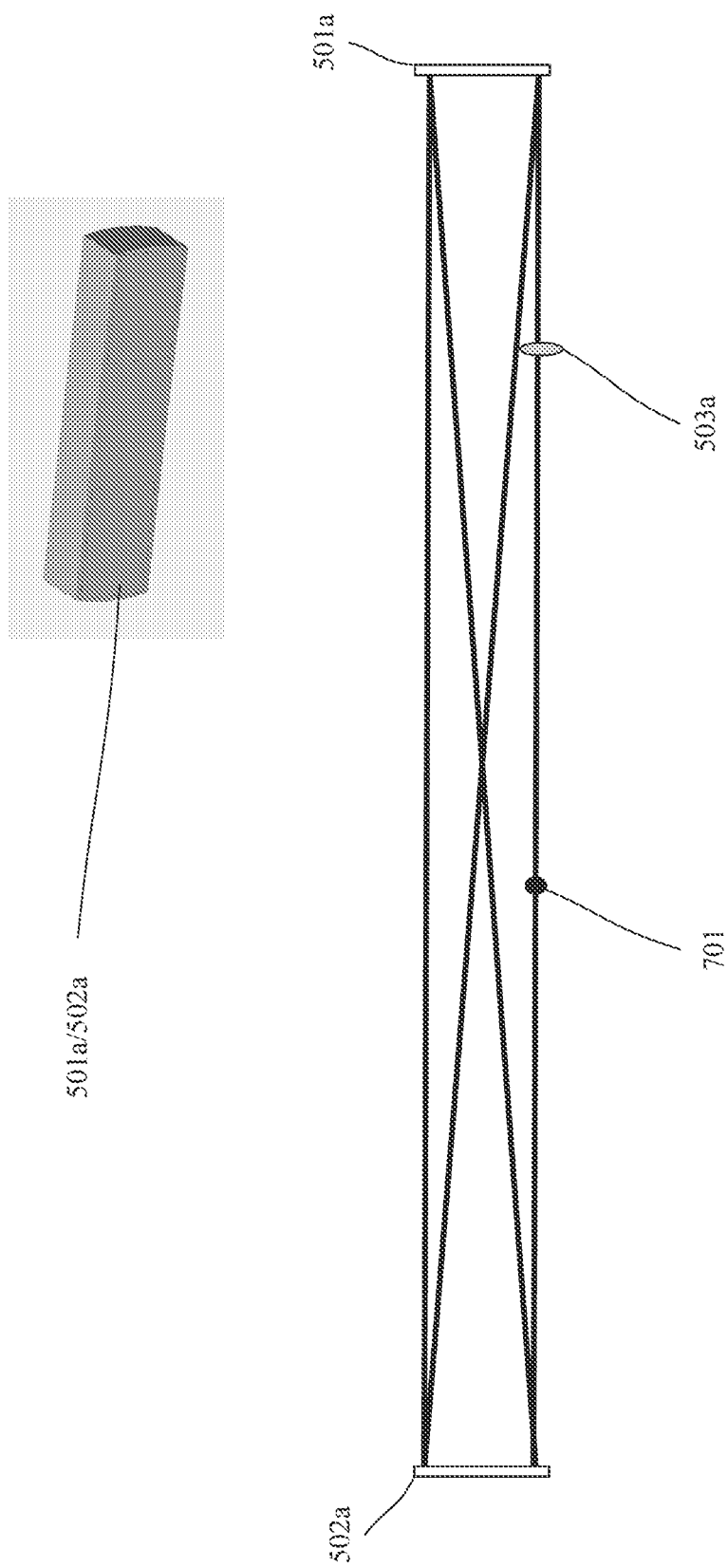
FIG. 7A illustrates a schematic top view of the first stage of the second optical pulse stretcher, according to some embodiments of the present disclosure.

FIG. 7A illustrates a schematic top view of the first stage of second optical pulse stretcher 401b, according to some embodiments of the present disclosure. As illustrated in FIG. 7A, the first stage of second optical pulse stretcher 401b can include two mirrors 501a and 502a, beam splitter 503a, and an optional compensator 701.

According to some embodiments, mirrors 501a and 502a of the first stage of second optical pulse stretcher 401b can include rectangular concave mirrors. For example, two large rectangular concave mirrors can be used but in other embodiments other shapes are used. According to some embodiments, the reflective surface of mirrors 501a and 502a can be spherically concave such that the distance between mirrors 501a and 502a is equal to (or about equal to) the radius of the curvature of each of mirrors 501a and 502a. For example, mirrors 501a and 502a can be designed and positioned based on a telecentric design. The concave mirrors can be designed with orthogonal tip-tilt adjustment, according to some embodiments. According to some embodiments, and compared to, for example, circular mirrors, mirrors 501a and 502a can be relatively insensitive to mirror misalignment, can have less part count can simplify their mount design, and/or can be easier to align with reduced parts and freedom.

According to some embodiments, the individual curvatures and sizes of mirrors 501a and 502a can be designed to position beam splitter 503a closer to one of the banks of mirrors (e.g., closer to mirror 501a) to allow an upper beam splitter (e.g., the beam splitter in an upper stage of second optical pulse stretcher 401b) to be placed after the excimer laser cavities to allow the pulse stretchers to properly fit in an allocated location in laser system. For example, beam splitter 503a can be a "D" shape beam splitter. However, the embodiments of this disclosure are not limited to these examples and various other types of beam splitters and/or various other configurations of beam splitters and mirrors can also be used.

According to some embodiments, beam splitter 503a is positioned relative to the center of curvature of mirrors 501a and/or 502a to "flatten" each of the circuits to enable the laser beam to propagate in the same plane (e.g., parallel to the floor).

According to some embodiments, optional compensator 701 can include a compensator plate configured to compensate the laser beam walk off from a finite thickness of beam splitter 503a and reduce degree of freedom (DOF) in mirror adjustment (for example, 4 DOF in large mirror design compared to 8 DOF in small mirror design).

According to some embodiments, the distance between mirrors 501a and 502a can be adjusted during manufacturing and tip/tilt adjustment of mirrors can be done in field.

Figure 7B:
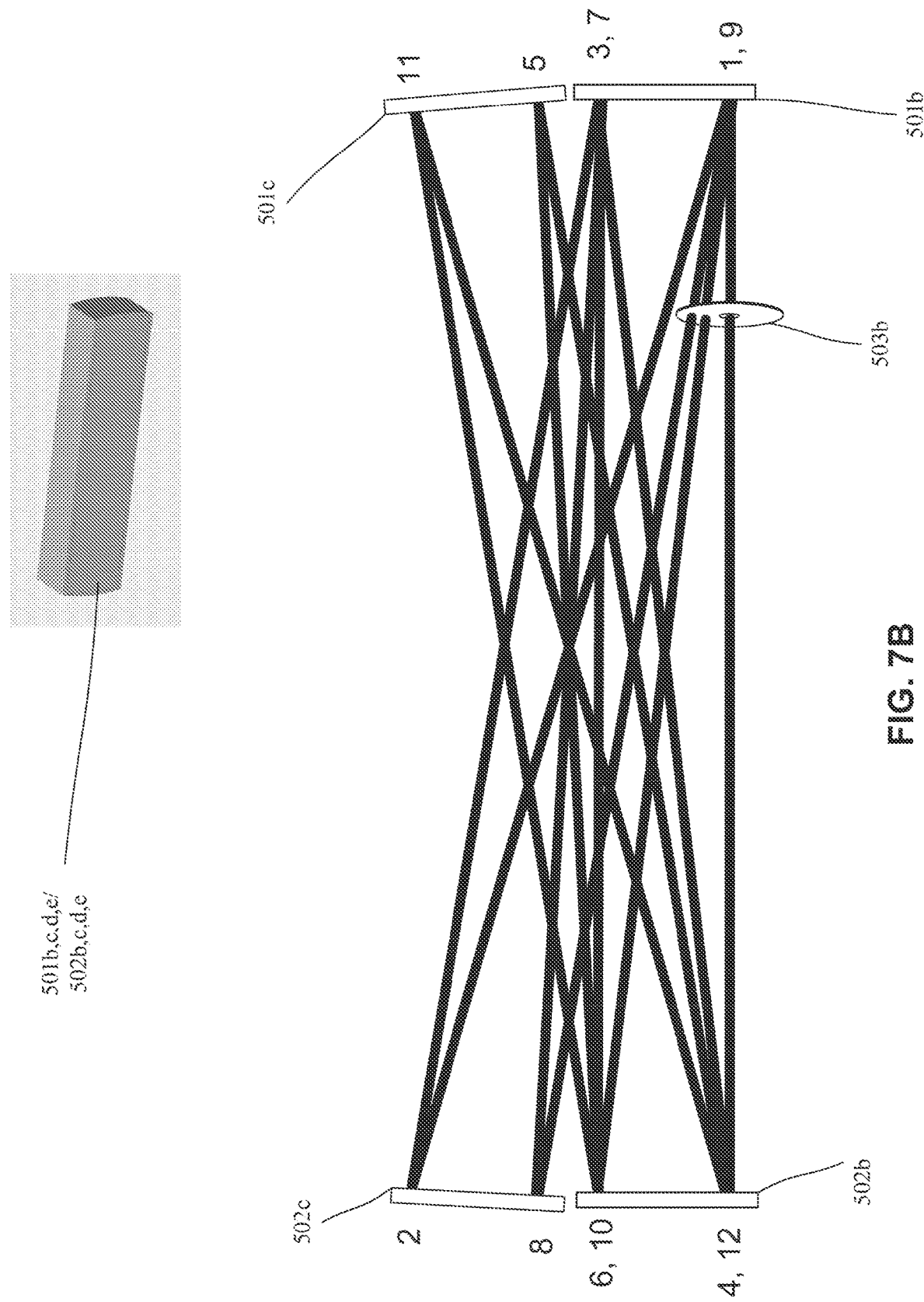
FIG. 7B illustrates a schematic top view of the second or the third stage of the second optical pulse stretcher, according to some embodiments of the present disclosure.

FIG. 7B illustrates a schematic top view of the second or the third stage of second optical pulse stretcher 401b, according to some embodiments of the present disclosure. As illustrated in FIG. 7B, the second or the third stage of second optical pulse stretcher 401b can include four mirrors 501b, 501c, 502b, and 502c and beam splitter 503b.

FIG. 7B is discussed with respect to the second stage of second optical pulse stretcher 401b. However, the third stage of second optical pulse stretcher 401b can be the same or similar. According to some embodiments, mirrors 501b, 501c, 502b, and 502c of the second stage of second optical pulse stretcher 401b can include rectangular concave mirrors. For example, two large rectangular concave mirrors can be used but in other embodiments other shapes are used.

According to some embodiments, the reflective surface of mirrors 501b, 501c, 502b, and 502c can be spherically concave such that the distance between mirrors 501b and 502b (or mirrors 501c and 502c) is equal to (or about equal to) the radius of the curvature of each of mirrors 501b, 501c, 502b, and 502c. For example, mirrors 501b, 501c, 502b, and 502c can be designed and positioned based on a telecentric design. The concave mirrors can be designed with orthogonal tip-tilt adjustment, according to some embodiments. According to some embodiments, and compared to, for example, circular mirrors, mirrors 501b, 501c, 502b, and 502c can be relatively insensitive to mirror misalignment, can have less part count can simplify their mount design, and/or can be easier to align with reduced parts and freedom.

According to some embodiments, the individual curvatures and sizes of mirrors 501b, 501c, 502b, and 502c can be designed to position beam splitter 503b closer to one of the banks of mirrors (e.g., closer to mirrors 501b and 501c) to allow an upper beam splitter (e.g., the beam splitter in an upper stage of second optical pulse stretcher 401b) to be placed after the excimer laser cavities to allow the pulse stretchers to properly fit in the allocated laser volume. For example, beam splitter 503b can be a "D" shape beam splitter. However, the embodiments of this disclosure are not limited to these examples and various other types of beam splitters and/or various other configurations of beam splitters and mirrors can also be used.

According to some embodiments, beam splitter 503b is positioned relative to the center of curvature of mirrors 501b, 501c, 502b, and/or 502c to "flatten" each of the circuits to enable the laser beam to propagate in the same plane (e.g., parallel to the floor).

According to some embodiments, an optional compensator (not shown—similar to compensator 701 of FIG. 7A) can be used. The optional compensator can include a compensator plate configured to compensate the laser beam walk off from a finite thickness of beam splitter 503b and reduce degree of freedom (DOF) in mirror adjustment (for example, 4 DOF in large mirror design compared to 8 DOF in small mirror design).

According to some embodiments, the distance between mirrors 501b, 501c, 502b, and 502c can be adjusted during manufacturing and tip/tilt adjustment of mirrors can be performed in the field.

According to some embodiments, the path of the propagation of the laser beam within the second stage (and/or the third stage) of second optical pulse stretcher 401b can be similar to the path of propagation of the laser beam as discussed in U.S. Pat. No. 7,415,056, which is incorporated by reference herein in its entirety.

In this example, laser beam is entered the second stage of second optical pulse stretcher 401b using, for example, beam splitter 503b. According to some embodiments, the entered laser beam can be a laser beam output of the first stage of second optical pulse stretcher 401b. The laser beam is incident at a first point 1 on mirror 501b. From point 1 on mirror 501b, the reflected beam is incident on point 2 on mirror 502c. From point 2 on mirror 502c, the reflected beam is incident on point 3 on mirror 501b. From point 3 on mirror 501b, the reflected beam is incident on point 4 on mirror 502b. From point 4 on mirror 502b, the reflected beam is incident on point 5 on mirror 501c. From point 5 on mirror 501c, the reflected beam is incident on point 6 on mirror 502b.

From point 5 on mirror 502b, the reflected beam is incident on point 7 on mirror 501b. From point 7 on mirror 501b, the reflected beam is incident on point 8 on mirror 502c. From point 8 on mirror 502c, the reflected beam is incident on point 9 on mirror 501b. From point 9 on mirror 501b, the reflected beam is incident on point 10 on mirror 502b. From point 10 on mirror 502b, the reflected beam is incident on point 11 on mirror 501c. From point 11 on mirror 501c, the reflected beam is incident on point 12 on mirror 502b. From point 12 on mirror 502b, the reflected beam is incident on beam splitter 503b.

Using beam splitter 503b, the reflected beam from point 12 on mirror 502b can be reflected toward the third stage of second optical pulse stretcher 401b. Similar twelve reflections and beam propagation can occur in the third stage of second optical pulse stretcher 401b.

According to some embodiments, the first, second, and third stages of second optical pulse stretcher 401b (and/or the optical pulse stretcher stage of first optical pulse stretcher 401a) can be designed such that their design can be immune to initial misalignment and/or vibration problems during operations.

According to some embodiments, and as discussed above, the laser beam output of second optical pulse stretcher 401b is reflected back toward first optical pulse stretcher 401a to be reflected and to be sent out of laser source 400. According to some examples, because of the distance between second optical pulse stretcher 401b and the output laser source 400, first optical pulse stretcher 401a can include a beam relay. The beam relay of first optical pulse stretcher 401a is configured to receive the output of second optical pulse stretcher 401b and out laser beam 413 of FIG. 4. In some examples, the beam relay can include two more lenses configured in a telescopic configuration. Additionally, or alternatively, the beam relay can include one or more apertures.

Figure 8:
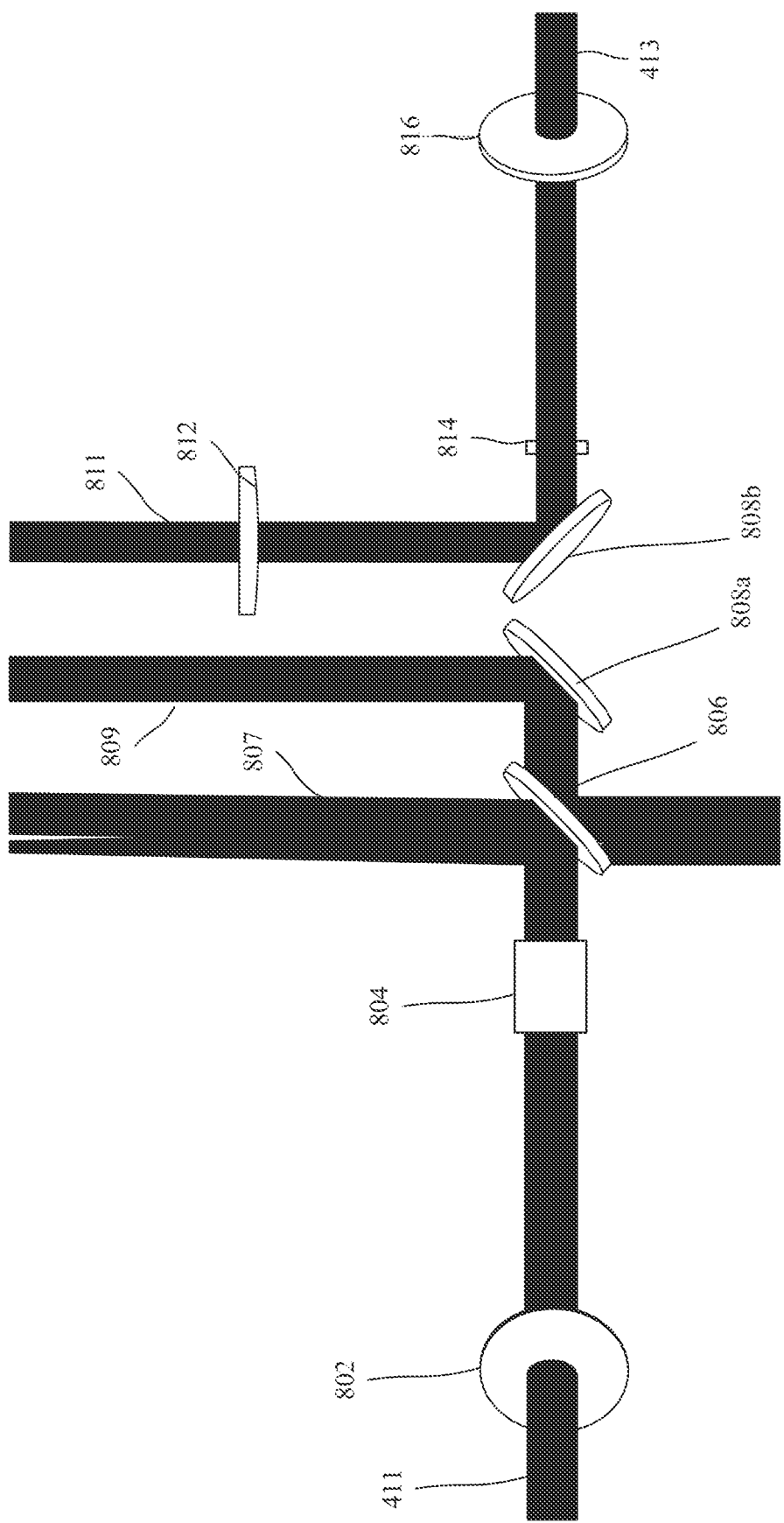
FIG. 8 illustrates a schematic view of part of the paths of laser beams in the first optical pulse stretcher, according to some embodiments of the present disclosure.

FIG. 8 illustrates a schematic view of part of the paths of laser beams in first optical pulse stretcher 401a, according to some embodiments of the present disclosure. According to some embodiments, second laser beam 411 of FIG. 4 is input to first optical pulse stretcher 401a. Second beam laser 411 can go through an optional beam splitter 802 and an optional alignment optic 804 (for example, an alignment prism). Alignment optic 804 can be used, for example, for alignment when assembling first optical pulse stretcher 401a for the purpose of aligning optical elements and/or beams. Alignment optic 804 can be removed during the operation of second optical pulse stretcher 401b and laser source 400.

Second laser beam 411 further can be incident on beam splitter of the optical pulse stretcher stage 507 of first optical pulse stretcher 401a. One portion 807 of second laser beam 411 can enter the optical pulse stretcher stage 507 of first optical pulse stretcher 401 to be optically stretched. The output of the optical pulse stretcher stage 507 of first optical pulse stretcher 401a can be reflected 809 using mirror 808a toward second optical pulse stretcher 401b. The output of second optical pulse stretcher 401b (e.g., laser beam 811) is sent back to first optical pulse stretcher 401a.

Optical element 812 can be an optional optical element of the optional beam relay discussed above. The output of second optical pulse stretcher 401b (e.g., laser beam 811) is reflected using mirror 808b. Reflected laser beam can travel through one or more optional system aperture 814 and/or beam splitter 816. Third laser beam 413 (of FIG. 4) is output of laser source 400.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

The above and following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the embodiments in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that the embodiments may be practiced otherwise than as described. The description is not intended to limit the embodiments.

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the present embodiments and the appended claims in any way.

Some embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the embodiments that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

Other aspects of the invention are set out in the following numbered clauses.

1. An optical pulse stretcher configured to receive a laser beam and generate an output pulse stretched laser beam, the optical pulse stretcher comprising:
    a first stage optical pulse stretcher comprising two or more mirrors and configured to receive a portion of the laser beam and generate a first pulse stretched laser beam;
    a second stage optical pulse stretcher comprising four or more mirrors and configured to receive a portion of the first pulse stretched laser beam and generate a second pulse stretched laser beam; and
    a third stage optical pulse stretcher comprising four or more mirrors and configured to receive a portion of the second pulse stretched laser beam and generate the output pulse stretched laser beam.

2. The optical pulse stretcher of clause 1, wherein the two or more mirrors of the first stage optical pulse stretcher, the four or more mirror of the second stage optical pulse stretcher, and the four or more mirrors of the third stage optical pulse stretcher comprise concave mirrors.

3. The optical pulse stretcher of clause 1, wherein the first stage optical pulse stretcher is configured to generate the first pulse stretched laser beam by reflecting the portion of the laser beam four times using the two or more mirrors of the first stage optical pulse stretcher.

4. The optical pulse stretcher of clause 3, wherein the second stage optical pulse stretcher is configured to generate the second pulse stretched laser beam by reflecting the portion of the first pulse stretched laser beam twelve times and the third stage optical pulse stretcher is configured to generate the output pulse stretched laser beam by reflecting the portion of the second pulse stretched laser beam twelve times.

5. The optical pulse stretcher of clause 1, wherein the second stage optical pulse stretcher is configured to generate the second pulse stretched laser beam by reflecting the portion of the first pulse stretched laser beam twelve times using the four or more mirrors of the second stage optical pulse stretcher.

6. The optical pulse stretcher of clause 1, wherein the third stage optical pulse stretcher is configured to generate the output pulse stretched laser beam by reflecting the portion of the second pulse stretched laser beam twelve times using the four or more mirrors of the third stage optical pulse stretcher.

7. The optical pulse stretcher of clause 1, further comprising:
    a first beam splitter corresponding to the first stage optical pulse stretcher and configured to receive the laser beam and direct the portion of the laser beam to the two or more mirrors of the first stage optical pulse stretcher.

8. The optical pulse stretcher of clause 7, wherein the first beam splitter is positioned closer to a first one of the two or more mirrors of the first optical pulse stretcher and wherein the first beam splitter is a D shape beam splitter.

9. The optical pulse stretcher of clause 7, wherein the first beam splitter is positioned relative to a center of curvature of the two or more mirrors to flatten the first stage optical pulse stretcher and to enable the portion of the laser beam to propagate in the first stage optical pulse stretcher in a same plane.

10. The optical pulse stretcher of clause 7, further comprising:
    a second beam splitter corresponding to the second stage optical pulse stretcher and configured to receive the first pulse stretched laser beam and direct the portion of the first pulse stretched laser beam to the four or more mirrors of the second stage optical pulse stretcher.

11. The optical pulse stretcher of clause 10, wherein the second beam splitter is positioned relative to a center of curvature of the four or more mirrors of the second stage optical pulse stretcher to flatten the second stage optical pulse stretcher and to enable the portion of the first pulse stretched laser beam to propagate in the second stage optical pulse stretcher in a same plane.

12. The optical pulse stretcher of clause 10, further comprising:
    a third beam splitter corresponding to the third stage optical pulse stretcher and configured to receive the second pulse stretched laser beam and direct the portion of the second pulse stretched laser beam to the four or more mirrors of the third stage optical pulse stretcher.

13. The optical pulse stretcher of clause 12, wherein the third beam splitter is positioned relative to a center of curvature of the four or more mirrors of the third stage optical pulse stretcher to flatten the third stage optical pulse stretcher and to enable the portion of the second pulse stretched laser beam to propagate in the third stage optical pulse stretcher in a same plane.

14. The optical pulse stretcher of clause 12, wherein:
    the second beam splitter is positioned closer to a first pair of the four or more mirrors of the second optical pulse stretcher,
    the second beam splitter is a D shape beam splitter, the third beam splitter is positioned closer to a first pair of the four or more mirrors of the third optical pulse stretcher, and
the third beam splitter is a D shape beam splitter.
15. The optical pulse stretcher of clause 1, wherein:
the laser beam received by the first stage optical pulse stretcher comprises a pulse stretched laser beam generated by an orthogonal stage optical pulse stretcher, and
the orthogonal stage optical pulse stretcher is positioned outside of and approximately perpendicular to the optical pulse stretcher.
16. The optical pulse stretcher of clause 15, wherein the orthogonal stage optical pulse stretcher is configured to reflect the portion of the laser beam four times.
17. A laser source, comprising:
an optical pulse stretcher configured to receive a laser beam and generate an output pulse stretched laser beam, the optical pulse stretcher comprising:
a first stage optical pulse stretcher comprising two or more mirrors and configured to receive a portion of the laser beam and generate a first pulse stretched laser beam;
a second stage optical pulse stretcher comprising four or more mirrors and configured to receive a portion of the first pulse stretched laser beam and generate a second pulse stretched laser beam; and
a third stage optical pulse stretcher comprising four or more mirrors and configured to receive a portion of the second pulse stretched laser beam and generate the output pulse stretched laser beam.
18. A lithographic apparatus, comprising:
an illumination system configured to condition a radiation beam;
a support structure configured to support a patterning device;
a substrate table configured to hold a substrate; and
a projection system configured to project a pattern imparted to the radiation beam by the patterning device onto a target portion of the substrate,
wherein the illumination system comprises a laser source, the laser source comprising an optical pulse stretcher configured to receive a laser beam and generate an output pulse stretched laser beam, the optical pulse stretcher comprising:
a first stage optical pulse stretcher comprising a first plurality of confocal resonators and configured to receive a portion of the laser beam and generate a first pulse stretched laser beam;
a second stage optical pulse stretcher comprising a second plurality of confocal resonators and configured to receive a portion of the first pulse stretched laser beam and generate a second pulse stretched laser beam; and
a third stage optical pulse stretcher comprising a third plurality of confocal resonators and configured to receive a portion of the second pulse stretched laser beam and generate the output pulse stretched laser beam.
19. The lithographic apparatus of clause 18, wherein:
the first plurality of confocal resonators comprises two or more concave mirrors,
the second plurality of confocal resonators comprises four or more concave mirrors, and
the third plurality of confocal resonators comprises four or more concave mirrors.
20. The lithographic apparatus of clause 18, wherein:
the first stage optical pulse stretcher has a first optical delay,
the second stage optical pulse stretcher has a second optical delay equal to or greater than the first optical delay, and
the third stage optical pulse stretcher has a third optical delay equal to or greater than the second optical delay.
21. The lithographic apparatus of clause 18, wherein:
the first stage optical pulse stretcher is configured to generate the first pulse stretched laser beam by reflecting the portion of the laser beam four times,
the second stage optical pulse stretcher is configured to generate the second pulse stretched laser beam by reflecting the portion of the first pulse stretched laser beam twelve times, and
the third stage optical pulse stretcher is configured to generate the output pulse stretched laser beam by reflecting the portion of the second pulse stretched laser beam twelve times.
22. The lithographic apparatus of clause 18, wherein the laser source further comprises:
an orthogonal stage optical pulse stretcher configured to direct the laser beam to the optical pulse stretcher, the orthogonal stage optical pulse stretcher positioned outside of and approximately perpendicular to the optical pulse stretcher.
23. The lithographic apparatus of clause 22, wherein the orthogonal stage optical pulse stretcher comprises four circular concave mirrors.
24. The lithographic apparatus of clause 22, further comprising:
a beam relay configured to receive the output pulse stretched laser beam and output the output pulse stretched laser beam from the laser source.
25. An optical pulse stretcher configured to receive a laser beam and generate an output pulse stretched laser beam, the optical pulse stretcher comprising:
two or more confocal optical pulse stretchers stacked in the optical pulse stretcher,
wherein a first one of the two or more confocal optical pulse stretchers is configured to receive a portion of the laser beam and generate a first pulse stretched laser beam by reflecting the portion of the laser beam four times, and
a second one of the two or more confocal optical pulse stretchers is configured to receive a portion of the first pulse stretched laser beam and generate a second pulse stretched laser beam by reflecting the portion of the first pulse stretched laser beam twelve times.
26. The optical pulse stretcher of clause 25, wherein the first one of the two or more confocal optical pulse stretchers has a first optical delay, and the second one of the two or more confocal optical pulse stretchers has a second optical delay equal to or greater than the first optical delay.
27. An extended optical pulse stretcher, comprising:
a first stage optical pulse stretcher comprising a first plurality of confocal resonators and configured to receive a laser beam and generate a first pulse stretched laser beam;
a stacked confocal pulse stretcher comprising:
a second stage optical pulse stretcher comprising a second plurality of confocal resonators and configured to receive a portion of the first pulse stretched laser beam and generate a second pulse stretched laser beam;
a third stage optical pulse stretcher comprising a third plurality of confocal resonators and configured to receive a portion of the second pulse stretched laser beam and generate a third pulse stretched laser beam;

a fourth stage optical pulse stretcher comprising a fourth plurality of confocal resonators and configured to receive a portion of the third pulse stretched laser beam and generate the output pulse stretched laser beam, wherein the first stage optical pulse stretcher is positioned approximately perpendicular to the stacked confocal pulse stretcher.

28. The extended optical pulse stretcher of clause 27, wherein:

the first stage optical pulse stretcher has a first optical delay, the second stage optical pulse stretcher has a second optical delay equal to or greater than the first optical delay, the third stage optical pulse stretcher has a third optical delay equal to or greater than the second optical delay, and the fourth stage optical pulse stretcher has a fourth optical delay equal to or greater than the second optical delay.

29. The extended optical pulse stretcher of clause 27, wherein:

the first stage optical pulse stretcher is configured to receive a portion of the laser beam and generate a first pulse stretched laser beam by reflecting the portion of the laser beam four times, the second stage optical pulse stretcher is configured to receive a portion of the laser beam and generate a second pulse stretched laser beam by reflecting the portion of the laser beam four times, the third stage optical pulse stretcher is configured to receive a portion of the laser beam and generate a third pulse stretched laser beam by reflecting the portion of the laser beam twelve times, and the fourth stage optical pulse is stretcher is configured to receive a portion of the laser beam and generate a fourth pulse stretched laser beam by reflecting the portion of the laser beam twelve times.

30. A method comprising:

generating a laser beam; and directing the laser beam through an optical pulse stretcher, the optical pulse stretcher comprising:

a first stage optical pulse stretcher comprising a first plurality of confocal resonators and configured to receive a portion of the laser beam and generate a first pulse stretched laser beam;

a second stage optical pulse stretcher comprising a second plurality of confocal resonators and configured to receive a portion of the first pulse stretched laser beam and generate a second pulse stretched laser beam; and a third stage optical pulse stretcher comprising a third plurality of confocal resonators and configured to receive a portion of the second pulse stretched laser beam and generate the output pulse stretched laser beam.

31. The method of clause 30, wherein the optical pulse stretcher further comprises an orthogonal stage optical pulse stretcher configured to direct the laser beam to the first stage optical pulse stretcher, the orthogonal stage optical pulse stretcher positioned approximately perpendicular to the first stage, second stage and third stage optical pulse stretchers.

The breadth and scope of the present disclosure should not be limited by any of the above-described exemplary embodiments, but should be defined only in accordance with the following claims and their equivalents.

What is claimed is:

1. An optical pulse stretcher configured to receive a laser beam and generate an output pulse stretched laser beam, the optical pulse stretcher comprising:

a first stage optical pulse stretcher comprising two or more first mirrors forming at least a first confocal resonator and configured to receive a portion of the laser beam and generate a first pulse stretched laser beam;

a second stage optical pulse stretcher comprising four or more second mirrors forming at least a second confocal resonator and configured to receive a portion of the first pulse stretched laser beam and generate a second pulse stretched laser beam, the four or more second mirrors distinct from the two or more first mirrors; and a third stage optical pulse stretcher comprising four or more third mirrors forming at least a third confocal resonator and configured to receive a portion of the second pulse stretched laser beam and generate the output pulse stretched laser beam, the four or more third mirrors distinct from the two or more first mirrors and the four or more second mirrors.

2. The optical pulse stretcher of claim 1, wherein the two or more first mirrors of the first stage optical pulse stretcher, the four or more second mirrors of the second stage optical pulse stretcher, and the four or more third mirrors of the third stage optical pulse stretcher comprise concave mirrors.

3. The optical pulse stretcher of claim 1, wherein the first stage optical pulse stretcher is configured to generate the first pulse stretched laser beam by reflecting the portion of the laser beam four times using the two or more first mirrors of the first stage optical pulse stretcher.

4. The optical pulse stretcher of claim 1, wherein the second stage optical pulse stretcher is configured to generate the second pulse stretched laser beam by reflecting the portion of the first pulse stretched laser beam twelve times using the four or more second mirrors of the second stage optical pulse stretcher.

5. The optical pulse stretcher of claim 1, further comprising:

a first beam splitter corresponding to the first stage optical pulse stretcher and configured to receive the laser beam and direct the portion of the laser beam to the two or more first mirrors of the first stage optical pulse stretcher.

6. The optical pulse stretcher of claim 5, wherein the first beam splitter is positioned relative to a center of curvature of the two or more first mirrors to flatten the first stage optical pulse stretcher and to enable the portion of the laser beam to propagate in the first stage optical pulse stretcher in a same plane.

7. The optical pulse stretcher of claim 5, further comprising:

a second beam splitter corresponding to the second stage optical pulse stretcher and configured to receive the first pulse stretched laser beam and direct the portion of the first pulse stretched laser beam to the four or more second mirrors of the second stage optical pulse stretcher.

8. The optical pulse stretcher of claim 7, further comprising:

a third beam splitter corresponding to the third stage optical pulse stretcher and configured to receive the second pulse stretched laser beam and direct the portion of the second pulse stretched laser beam to the four or more third mirrors of the third stage optical pulse stretcher.

9. The optical pulse stretcher of claim 8, wherein the third beam splitter is positioned relative to a center of curvature of the four or more third mirrors of the third stage optical pulse stretcher to flatten the third stage optical pulse stretcher and to enable the portion of the second pulse stretched laser beam to propagate in the third stage optical pulse stretcher in a same plane.

10. The optical pulse stretcher of claim 8, wherein:
the second beam splitter is positioned closer to a first pair of the four or more second mirrors of the second optical pulse stretcher,
the second beam splitter is a D shape beam splitter,
the third beam splitter is positioned closer to a first pair of the four or more third mirrors of the third optical pulse stretcher, and
the third beam splitter is a D shape beam splitter.

11. The optical pulse stretcher of claim 1, wherein:
the laser beam received by the first stage optical pulse stretcher comprises a pulse stretched laser beam generated by an orthogonal stage optical pulse stretcher, and
the orthogonal stage optical pulse stretcher is positioned outside of and approximately perpendicular to the optical pulse stretcher.

12. A laser source, comprising:
an optical pulse stretcher configured to receive a laser beam and generate an output pulse stretched laser beam, the optical pulse stretcher comprising:
a first stage optical pulse stretcher comprising two or more first mirrors forming at least a first confocal resonator and configured to receive a portion of the laser beam and generate a first pulse stretched laser beam;
a second stage optical pulse stretcher comprising four or more second mirrors forming at least a second confocal resonator and configured to receive a portion of the first pulse stretched laser beam and generate a second pulse stretched laser beam, the second mirrors being distinct from the first mirrors; and
a third stage optical pulse stretcher comprising four or more third mirrors forming at least a third confocal resonator and configured to receive a portion of the second pulse stretched laser beam and generate the output pulse stretched laser beam, the third mirrors being distinct from the first mirrors and the second mirrors.

13. A lithographic apparatus, comprising:
an illumination system configured to condition a radiation beam;
a support structure configured to support a patterning device;
a substrate table configured to hold a substrate; and
a projection system configured to project a pattern imparted to the radiation beam by the patterning device onto a target portion of the substrate,
wherein the illumination system comprises a laser source, the laser source comprising an optical pulse stretcher configured to receive a laser beam and generate an output pulse stretched laser beam, the optical pulse stretcher comprising:
a first stage optical pulse stretcher comprising at least a first confocal resonator and configured to receive a portion of the laser beam and generate a first pulse stretched laser beam;
a second stage optical pulse stretcher comprising at least a second confocal resonator distinct from the at least first confocal resonator, and configured to receive a portion of the first pulse stretched laser beam and generate a second pulse stretched laser beam; and
a third stage optical pulse stretcher comprising at least a third confocal resonator distinct from the at least first confocal resonator and the at least second confocal resonator, and configured to receive a portion of the second pulse stretched laser beam and generate the output pulse stretched laser beam.

14. The lithographic apparatus of claim 13, wherein:
the first stage optical pulse stretcher has a first optical delay,
the second stage optical pulse stretcher has a second optical delay equal to or greater than the first optical delay, and
the third stage optical pulse stretcher has a third optical delay equal to or greater than the second optical delay.

15. The lithographic apparatus of claim 13, wherein:
the first stage optical pulse stretcher is configured to generate the first pulse stretched laser beam by reflecting the portion of the laser beam four times,
the second stage optical pulse stretcher is configured to generate the second pulse stretched laser beam by reflecting the portion of the first pulse stretched laser beam twelve times, and
the third stage optical pulse stretcher is configured to generate the output pulse stretched laser beam by reflecting the portion of the second pulse stretched laser beam twelve times.

16. The lithographic apparatus of claim 13, wherein the laser source further comprises:
an orthogonal stage optical pulse stretcher configured to direct the laser beam to the optical pulse stretcher, the orthogonal stage optical pulse stretcher positioned outside of and approximately perpendicular to the optical pulse stretcher.

17. The lithographic apparatus of claim 16, wherein the orthogonal stage optical pulse stretcher comprises four circular concave mirrors.

18. An optical pulse stretcher configured to receive a laser beam and generate an output pulse stretched laser beam, the optical pulse stretcher comprising:
two or more confocal optical pulse stretchers stacked in the optical pulse stretcher,
wherein a first one of the two or more confocal optical pulse stretchers is configured to receive a portion of the laser beam and generate a first pulse stretched laser beam by reflecting the portion of the laser beam four times, and
a second one of the two or more confocal optical pulse stretchers is configured to receive a portion of the first pulse stretched laser beam and generate a second pulse stretched laser beam by reflecting the portion of the first pulse stretched laser beam twelve times.

19. An extended optical pulse stretcher, comprising:
a first stage optical pulse stretcher comprising at least a first confocal resonator and configured to receive a laser beam and generate a first pulse stretched laser beam; and
a stacked confocal pulse stretcher comprising:
a second stage optical pulse stretcher comprising at least a second confocal resonator and configured to receive a portion of the first pulse stretched laser beam and generate a second pulse stretched laser beam;

a third stage optical pulse stretcher comprising at least a third confocal resonator and configured to receive a portion of the second pulse stretched laser beam and generate a third pulse stretched laser beam; and a fourth stage optical pulse stretcher comprising at least a fourth confocal resonator and configured to receive a portion of the third pulse stretched laser beam and generate the output pulse stretched laser beam, wherein the first stage optical pulse stretcher is positioned approximately perpendicular to the stacked confocal pulse stretcher.

20. The extended optical pulse stretcher of claim 19, wherein:

the first stage optical pulse stretcher has a first optical delay, the second stage optical pulse stretcher has a second optical delay equal to or greater than the first optical delay, the third stage optical pulse stretcher has a third optical delay equal to or greater than the second optical delay, and the fourth stage optical pulse stretcher has a fourth optical delay equal to or greater than the second optical delay.

21. An optical pulse stretcher configured to receive a laser beam and generate an output pulse stretched laser beam, the optical pulse stretcher comprising:

a parallel stage optical pulse stretcher comprising a plurality of mirrors and configured to receive a portion of the laser beam and generate a pulse stretched laser beam, the plurality of mirrors including sets of mirrors disposed at opposite longitudinal ends of the parallel stage optical pulse stretcher, wherein the longitudinal axis of the parallel stage optical pulse stretcher is parallel to the direction of the laser beam when the laser beam exits a laser chamber.

22. The optical pulse stretcher of claim 21, further comprising:

a first beam splitter corresponding to the parallel stage optical pulse stretcher and configured to receive the laser beam and direct the portion of the laser beam to the plurality of mirrors of the parallel stage optical pulse stretcher.

23. The optical pulse stretcher of claim 21, wherein the plurality of mirrors forms at least one confocal resonator.

24. The optical pulse stretcher of claim 21, wherein the parallel stage optical pulse stretcher comprises at least three stages of confocal optical pulse stretchers.

25. The optical pulse stretcher of claim 21, wherein the mirrors disposed at opposite longitudinal ends of the parallel stage optical pulse stretcher at separated from each other by 2 to 4 meters.

26. The optical pulse stretcher of claim 21, wherein the mirrors include concave mirrors, rectangular concave mirrors, or spherically concave mirrors.

27. An optical pulse stretcher configured to receive a laser beam and generate an output pulse stretched laser beam, the optical pulse stretcher comprising:

a first stage optical pulse stretcher comprising two or more mirrors and configured to receive a portion of the laser beam and generate a first pulse stretched laser beam, a second stage optical pulse stretcher comprising four or more mirrors and configured to receive a portion of the first pulse stretched laser beam and generate a second pulse stretched laser beam, wherein a longitudinal axis of the first stage optical pulse stretcher is orthogonal to a longitudinal axis of the second stage optical pulse stretcher.

28. The optical pulse stretcher of claim 27, further comprising:

a first beam splitter corresponding to the first stage optical pulse stretcher and configured to receive the laser beam and direct the portion of the laser beam to the two or more mirrors of the first stage optical pulse stretcher.

29. The optical pulse stretcher of claim 28, wherein the first beam splitter is positioned closer to a first one of the two or more mirrors of the first optical pulse stretcher and wherein the first beam splitter is a D shape beam splitter.

30. The optical pulse stretcher of claim 28, wherein the first beam splitter is positioned relative to a center of curvature of the two or more mirrors to flatten the first stage optical pulse stretcher and to enable the portion of the laser beam to propagate in the first stage optical pulse stretcher in a same plane.

31. The optical pulse stretcher of claim 28, further comprising:

a second beam splitter corresponding to the second stage optical pulse stretcher and configured to receive the first pulse stretched laser beam and direct the portion of the first pulse stretched laser beam to the four or more mirrors of the second stage optical pulse stretcher.

32. The optical pulse stretcher of claim 27, further comprising a third stage optical pulse stretcher comprising four or more mirrors and configured to receive a portion of the second pulse stretched laser beam and generate the output pulse stretched laser beam.

33. An optical pulse stretcher configured to receive a laser beam and generate an output pulse stretched laser beam, the optical pulse stretcher comprising:

a first stage optical pulse stretcher comprising two or more mirrors and configured to receive a portion of the laser beam and generate a first pulse stretched laser beam, a longitudinal axis of the first stage optical pulse stretcher oriented orthogonal to the laser beam, a second stage optical pulse stretcher comprising four or more mirrors and configured to receive a portion of the first pulse stretched laser beam and generate a second pulse stretched laser beam, the second stage optical pulse stretcher having a longitudinal axis oriented orthogonal to the longitudinal axis of the first stage optical pulse stretcher.

34. The optical pulse stretcher of claim 33, further comprising:

a first beam splitter corresponding to the first stage optical pulse stretcher and configured to receive the laser beam and direct the portion of the laser beam to the two or more mirrors of the first stage optical pulse stretcher.

35. The optical pulse stretcher of claim 34, wherein the first beam splitter is positioned relative to a center of curvature of the two or more mirrors to flatten the first stage optical pulse stretcher and to enable the portion of the laser beam to propagate in the first stage optical pulse stretcher in a same plane.

36. The optical pulse stretcher of claim 34, further comprising:

a second beam splitter corresponding to the second stage optical pulse stretcher and configured to receive the first pulse stretched laser beam and direct the portion of the first pulse stretched laser beam to the four or more mirrors of the second stage optical pulse stretcher.

37. The optical pulse stretcher of claim 36, wherein the two or more mirrors of the first stage optical pulse stretcher include sets of mirrors disposed at opposite longitudinal ends of the first stage optical pulse stretcher, and further comprising:
 a third stage optical pulse stretcher comprising four or more mirrors and configured to receive a portion of the second pulse stretched laser beam and generate the output pulse stretched laser beam.

38. The optical pulse stretcher of claim 37, wherein the two or more mirrors of the first stage optical pulse stretcher, the four or more mirror of the second stage optical pulse stretcher, and the four or more mirrors of the third stage optical pulse stretcher comprise concave mirrors.

\* \* \* \* \*